(12) United States Patent
Amiya et al.

(10) Patent No.: US 10,978,620 B2
(45) Date of Patent: Apr. 13, 2021

(54) LIGHT EMITTING DEVICE, ILLUMINATION DEVICE AND PLANT CULTIVATION METHOD

(71) Applicant: NICHIA CORPORATION, Anan (JP)

(72) Inventors: Mika Amiya, Naruto (JP); Kazushige Fujio, Tokushima (JP); Tomokazu Suzuki, Tokushima (JP)

(73) Assignee: NICHIA CORPORATION, Anan (JP)

( * ) Notice: Subject to any disclaimer, the term of this patent is extended or adjusted under 35 U.S.C. 154(b) by 86 days.

(21) Appl. No.: 16/203,025

(22) Filed: Nov. 28, 2018

(65) Prior Publication Data
US 2019/0165221 A1 May 30, 2019

(30) Foreign Application Priority Data

Nov. 30, 2017 (JP) .............................. JP2017-230570
Nov. 15, 2018 (JP) .............................. JP2018-214919

(51) Int. Cl.
*H01L 33/50* (2010.01)
*A01G 7/04* (2006.01)
(Continued)

(52) U.S. Cl.
CPC ............ *H01L 33/504* (2013.01); *A01G 7/045* (2013.01); *C09K 11/0883* (2013.01);
(Continued)

(58) Field of Classification Search
CPC ... C09K 11/616; C09K 11/025; C09K 11/617; C09K 11/7734; C09K 11/7774;
(Continued)

(56) References Cited

U.S. PATENT DOCUMENTS 9,030,089 B2    5/2015    Komada et al.
9,504,207 B2    11/2016    Onuma et al.
(Continued)

FOREIGN PATENT DOCUMENTS

EP    2727458 A1    5/2014
EP    3262924 A1    1/2018
(Continued)

OTHER PUBLICATIONS

Kana, Shirai et al, Plant Growth Effect of White LED with Different Spectral Distribution, Proceedings in 2016 Kanazawa General Meeting by the Japan Society of Agricultural Biological and Environmental Engineers and Scientists, Japan, pp. 40-41.

*Primary Examiner* — Mouloucoulaye Inoussa
(74) *Attorney, Agent, or Firm* — Hunton Andrews Kurth LLP

(57) ABSTRACT

Provided are a light emitting device and an illumination device. The light emitting device is provided with a light emitting element having a light emission peak wavelength in a wavelength range of 380 nm or more and 490 nm or less, a first fluorescent material which is excited by the light from the light emitting element to emit light having at least one light emission peak wavelength in a wavelength range of 580 nm or more and less than 680, and a second fluorescent material which is excited by the light from the light emitting element to emit light having at least one light emission peak wavelength in a wavelength range of 680 nm or more and 800 nm or less, wherein a ratio R/B of a photon flux R of red light in a wavelength range of 620 nm or more and less than 700 nm to a photon flux B of blue light in a wavelength range of 400 nm or more and 490 nm or less is more than 4 and 50 or less, a ratio R/Fr of the photon flux R to a photon flux Fr of far-red light in a wavelength range of 700 nm or more and 780 nm or less is 0.1 or more and 10 or less, and the second fluorescent material contains at least one fluo- (Continued)

rescent material selected from the group consisting of a first aluminate fluorescent material and a second aluminate fluorescent material.

11 Claims, 11 Drawing Sheets

(51) Int. Cl.
*H01L 33/26* (2010.01)
*C09K 11/77* (2006.01)
*C09K 11/08* (2006.01)
*C09K 11/68* (2006.01)

(52) U.S. Cl.
CPC ........ *C09K 11/685* (2013.01); *C09K 11/7734* (2013.01); *C09K 11/7774* (2013.01); *H01L 33/26* (2013.01)

(58) Field of Classification Search
CPC ............. C09K 11/685; C09K 11/0883; C09K 11/7788; C09K 11/778; C09K 11/7794; C09K 11/7721; C09K 11/661; C09K 11/7739; H01L 33/502; H01L 33/505; H01L 33/486; H01L 33/504; H01L 33/26; A01G 7/045; H05B 33/14
USPC .......................................................... 313/498
See application file for complete search history.

(56) References Cited

U.S. PATENT DOCUMENTS

| | | | |
|---|---|---|---|
| 9,666,769 B2 | 5/2017 | Osaki et al. | |
| 2012/0218750 A1* | 8/2012 | Klase | A01G 7/045 362/231 |
| 2012/0267997 A1* | 10/2012 | Kijima | C09K 11/7739 313/498 |
| 2013/0127329 A1 | 5/2013 | Komada et al. | |
| 2013/0264934 A1 | 10/2013 | Osaki et al. | |
| 2014/0340890 A1* | 11/2014 | Hata | H01L 33/50 362/231 |
| 2015/0327446 A1 | 11/2015 | Kawaguchi et al. | |
| 2015/0357532 A1 | 12/2015 | Onuma et al. | |
| 2018/0000016 A1* | 1/2018 | Amiya | A01G 22/00 |
| 2019/0031954 A1 | 1/2019 | Okura et al. | |

FOREIGN PATENT DOCUMENTS

| | | |
|---|---|---|
| JP | 2012165665 A | 9/2012 |
| JP | 2013-106550 A | 6/2013 |
| JP | 2016111190 A | 6/2016 |
| JP | 2016121226 A | 7/2016 |
| JP | 2017186524 A | 10/2017 |
| WO | 2010053341 A1 | 5/2010 |
| WO | 2012/070435 A1 | 5/2012 |
| WO | 2014/103671 A1 | 7/2014 |
| WO | 2014/125714 A1 | 8/2014 |
| WO | 2017/129351 A1 | 8/2017 |
| WO | 2017/164214 A1 | 9/2017 |

* cited by examiner

LIGHT EMITTING DEVICE, ILLUMINATION DEVICE AND PLANT CULTIVATION METHOD

CROSS-REFERENCE TO RELATED PATENT APPLICATION

This application claims priority to Japanese Patent Application No. 2017-230570, filed on Nov. 30, 2017, and Japanese Patent Application No. 2018-214919, filed on Nov. 15, 2018, the entire disclosures of which are incorporated herein by references in their entirety.

BACKGROUND

Technical Field

The present invention relates to a light emitting device, an illumination device and a plant cultivation method. In this specification, the "fluorescent material" is used in the same meaning as a "fluorescent phosphor."

Description of Related Art

With environmental changes due to climate change and other artificial disruption. It is desired that plants such as vegetables are supplied stably and enhance plant production efficiency. For example, artificially controllable plant factories can stably supply clean and safe vegetables to market, and are expected to be a next-generation industry. In plant factories, for power saving and for efficiently growing plants, a light emitting device using a light emitting diode (LED) is employed.

Reaction of plants to light is grouped into photosynthesis and photomorphogenesis, and photosynthesis is a reaction of synthesizing organic materials using a light energy. On the other hand, photomorphogenesis is a morphogenetic reaction using light as a signal, and is a reaction of carrying out seed germination, differentiation (shoot formation, leaf formation), movement (pore opening and closing, chloroplast movement), phototropism, etc. A plant has plural photoreceptors (pigments), and chlorophyll and carotenoid carry out photosynthesis.

For example, International Unexamined Patent Publication No. WO2012/070435 discloses a light emitting device containing, as combined, a red LED having a light emission peak wavelength in a wavelength range of 630 nm to 680 nm and two LEDs each having a different light emission peak wavelength in a wavelength range of 380 nm to 480 nm. This also discloses a light emitting device containing, as combined, a blue LED chip that emits light having a light emission peak wavelength in a wavelength range of 400 nm to 480 nm corresponding to the blue range absorption peak of chlorophyll, and a red fluorescent material that absorbs the light from the blue LED chip to emit light having an emission peak wavelength in a wavelength range of 620 nm to 700 nm corresponding to the red range absorption peak of chlorophyll.

Plants have chlorophyll, carotenoid and other photoreceptors (pigments) such as phytochrome, which is a photoreceptor for red light and far-red light, and cryptochrome and phototropin, which are photoreceptors for blue light and near-ultraviolet ray (UV-A), respectively. For example, phytochrome absorbs red light and far-red light to promote photomorphogenesis of plants such as induction of seed germination, development of cotyledon, stem elongation and phototropism thereof.

Using the photoreceptors thereof, plants sense photoenvironments to initiate reaction of photosynthesis or photomorphogenesis. The wavelength range (300 nm or more and 800 nm or less) that plants can utilize for photosynthesis or photomorphogenesis is almost the same as the wavelength range of visible light (380 nm or more and 780 nm or less). In the field of plants, radiation in a wavelength range to be usable for reaction of photosynthesis or photomorphogenesis is referred to as physiologically active radiation, and among it, radiation in a wavelength range of 400 nm or more and 700 nm or less that may be an energy source for plant growth is referred to as photosynthetically active radiation. In addition, regarding the wavelength range in the field of plants, in general, a wavelength range of from about 400 nm to about 500 nm may be referred to, for example, as B, a wavelength range of from about 500 nm to about 600 nm may be, for example, as G, a wavelength range of from about 600 nm to about 700 nm may be, for example, as R, and a wavelength range of from about 700 nm to about 800 nm may be, for example, as Fr. The index of light quantity effective for photosynthesis or photomorphogenesis of plants is represented by a photon flux or a photon flux density and not by a radiant flux. The spectral distribution of a light source having an influence on plant growth varies, though details thereof will be described hereinunder, for example, depending on the ratio of a photon flux falling within a specific wavelength range to a photon flux falling within any other specific wavelength range, R/B or R/Fr. For example, Non Patent Literature 1 (NPL 1) (Kana SHIRAI et al., Plant Growth Effect of White LED with Different Spectral Distribution, Proceedings in 2016 Kanazawa General Meeting by the Japan Society of Agricultural Biological and Environmental Engineers and Scientists, Japan, pp. 40-41) discloses in FIG. 11 that a difference in spectral distribution between light sources has an influence on, for example, the height of a romaine lettuce, saying that, when R/Fr is smaller, the height of a romaine lettuce is larger.

As disclosed in International Unexamined Patent Publication No. WO2012/070435, when a light emission peak wavelength capable of being readily absorbed by any other photoreceptor than chlorophyll can be radiated along with a light source that radiates a light emission peak wavelength capable of being readily absorbed by chlorophyll that participates in reaction of photosynthesis and in time with plant growth, then plant photomorphogenesis may be thereby promoted.

SUMMARY

Consequently, the present disclosure is to provide a light emitting device capable of promoting plant growth, an illumination device and a plant cultivation method.

The present invention includes the following embodiments.

A first embodiment of the present disclosure is a light emitting device, comprising:

a light emitting element having a light emission peak wavelength in a wavelength range of 380 nm or more and 490 nm or less; and a first fluorescent material which is excited by the light from the light emitting element to emit light having at least one light emission peak wavelength in a wavelength range of 580 nm or more and less than 680, and a second fluorescent material which is excited by the light from the light emitting element to emit light having at least one light emission peak wavelength in a wavelength range of 680 nm or more and 800 nm or less, wherein:

the second fluorescent material contains at least one fluorescent material selected from a first aluminate fluorescent material having a composition containing Al and Cr, and a second aluminate fluorescent material having a composition containing a first element Ln containing at least one element selected from the group consisting of rare earth elements except Ce, and Al, and optionally a second element M containing at least one element selected from the group consisting of Ga and In, and Ce, and Cr, and wherein, when the molar composition ratio of the total of Al and the second element M is taken as 5, the molar composition ratio of Ce is a product of a value of parameter x and 3, the molar composition ratio of Cr is a product of a value of parameter y and 3, the value of parameter x being in a range of exceeding 0.0002 and less than 0.50, and the value of parameter y being in a range of exceeding 0.0001 and less than 0.05, wherein the light emitting device emits light having a ratio R/B of a photon flux R to a photon flux B within a range of more than 4 and 50 or less, and a ratio R/Fr of the photon flux R to a photon flux Fr within a range of 0.1 or more and 10 or less, wherein the photon flux R is in a range of 620 nm or more and less than 700 nm, the photon flux B is in a range of 400 nm or more and 490 nm or less, the photon flux Fr is in a range of 700 nm or more and 780 nm or less.

A second embodiment of the present disclosure is an illumination device comprising a combination of the light emitting device and a light source that emits a light energy differing from that of the light emitting device.

A third embodiment of the present disclosure is a plant cultivation method of irradiating plants with the light emitted by the light emitting device.

According to embodiments of the present disclosure, a light emitting device capable of promoting growth plant an illumination device and a plant cultivation method be provided.

DETAILED DESCRIPTION

Figure 1:
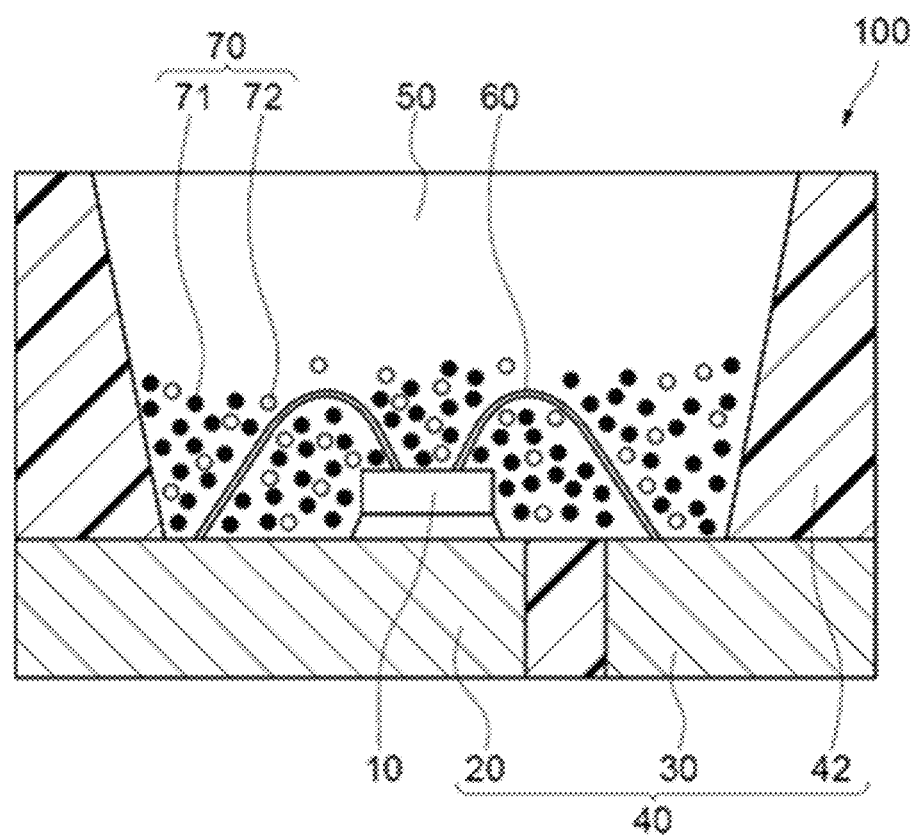
FIG. 1 is a schematic cross-sectional view of a light emitting device according to an embodiment of the present disclosure.

The light emitting device, the illumination device and the plant cultivation method of the present invention will be described below based on embodiments. The embodiments described below are exemplifies the technical concept of the present invention, and the present invention is not limited to the light emitting device, the illumination device and the plant cultivation method described below. In the present specification the relationship between the color names and the chromaticity coordinates, and the relationship between the wavelength range of light and the color names of monochromic light follows JIS Z8110.

Light Emitting Device

The first embodiment of the present disclosure is a light emitting device including a light emitting element having a light emission peak wavelength in a wavelength range of 380 nm or more and 490 nm or less (hereinafter this may be referred to as "near-ultraviolet to blue region"), a first fluorescent material which is excited by the light from the light emitting element to emit light having at least one light emission peak wavelength in a wavelength range of 580 nm or more and less than 680, and a second fluorescent material which is excited by the light from the light emitting element to emit light having at least one light emission peak wavelength in a wavelength range of 680 nm or more and 800 nm or less, wherein the ratio R/B is within a range of more than 4 and 50 or less and a ratio R/Fr is within range of 0.1 or more and 10 or less. The ratio R/B is a ratio of a photon flux R of red light in a wavelength range of 620 nm or more and less than 700 nm (hereinafter the photon flux R of red light in a wavelength range of 620 nm or more and less than 700 nm may be referred to as "photon flux R of red light") to a photon flux B of blue light in a wavelength range of 400 nm or more and 490 nm or less (hereinafter the photon flux B of blue light in a wavelength range of 400 nm or more and 490 nm or less may be referred to as "photon flux B of blue light"). The ratio R/Fr of the photon flux R of red light to a photon flux Fr of far-red light in a wavelength range of 700 nm or more and 780 nm or less (hereinafter the photon flux Fr of far-red light in a wavelength range of 700 nm or more and 780 nm or less may be referred to as "photon flux Fr of far-red light"). The second fluorescent material contains at least one fluorescent material selected from a first aluminate fluorescent material having a composition containing Al and Cr, and a second aluminate fluorescent material having a composition containing a first element Ln containing at least one element selected from the group consisting of rare earth elements except Ce, and Al, and optionally a second element M containing at least one element selected from the group consisting of Ga and In, and Ce, and Cr, and when the molar composition ratio of the total of Al and the second element M is taken as 5, the molar composition ratio of Ce is a product of a value of parameter x and 3, the molar composition ratio of Cr is a product of a value of parameter y and 3, the value of parameter x being in a range of exceeding 0.0002 and less than 0.50, and the value of parameter y being in a range of exceeding than 0.0001 and less than 0.05. In this description, the "molar composition ratio" means a molar ratio of each element in one mol of the chemical composition that represents a fluorescent material.

One example of the light emitting device of the first embodiment of the present disclosure is described with reference to the drawing. FIG. 1 is a schematic cross-sectional view showing a light emitting device of the first embodiment of the present disclosure, a light emitting device 100.

Light Emitting Device

The light emitting device 100 is, as shown in FIG. 1, provided with a support of, for example, a molded body 40, and a light emitting element 10, and a fluorescent member 50. The molded body 40 is composed of a first lead 20 and a second lead 30 as integrally molded with a resin part 42 containing a thermoplastic resin or a thermosetting resin. The molded body 40 forms a depression having a bottom and a side, and the light emitting element 10 is arranged on the bottom of the depression. The light emitting element 10 has a pair of positive and negative electrodes, and the pair of positive and negative electrodes are electrically connected to the first lead 20 and the second lead 30, respectively, each via a wire 60. The light emitting element 10 is covered with the fluorescent member 50. The fluorescent member 50 includes a fluorescent material 70 that undergoes wavelength conversion of the light from the light emitting element 10, and a resin. The fluorescent material 70 includes a first fluorescent material 71 and a second fluorescent material 72. The first lead 20 and the second lead 30 each connected to the pair of positive and negative electrodes of the light emitting element 10 is partly exposed toward outside a package constituting the light emitting device 100. The light emitting device 100 can emit light by receiving electric power supply from the outside through the first lead 20 and the second lead 30.

The light emitting device 100 is provided with the light emitting element 10 having a light emission peak wavelength in a wavelength range of 380 nm or more and 490 nm or less, the first fluorescent material 71 that is excited by the light from the light emitting element 10 to emit light having at least one light emission peak wavelength in a wavelength range of 580 nm or more and less than 680 nm, and the second florescent material 72 that is excited by the light from the light emitting element 10 to emit light having at least one light emission peak wavelength in a wavelength range of 680 nm or more and 800 nm or less.

Plants grow when photoreceptors (chlorophyll a and chlorophyll b) existing in the chloroplast therein absorb light and take carbon dioxide gas and water thereinto for photosynthesis to convert them into carbohydrates (saccharides). Chlorophyll a and chlorophyll b used for promoting plant cultivation have absorption peaks especially in a red region of 625 nm or more and 675 nm or less and in a blue region of 425 nm or more and 475 nm or less. In plants, photosynthesis by chlorophylls occurs mainly in a wavelength range of 400 nm or more and 700 nm or less, and further, chlorophyll a and chlorophyll b have local absorption peaks even in a region of 700 nm or more and 800 nm or less. For example, when plants are exposed to light having a longer wavelength than the absorption peak (around 680 nm) in the red region of chlorophyll a, the activity of photosynthesis therein suddenly lowers, and this phenomenon is called red drop. However, it is known that, when plants are exposed to light in a red region along with light containing a far-red region of 700 nm or more, photosynthesis therein is activated owing to the synergistic effect of these two kinds of light. This phenomenon is called an Emmerson effect.

Plants have, as a photoreceptor (pigment), phytochrome that is a photoreceptor for red light and far-red light. Phytochrome includes a red light-absorbing (Pr-type) phytochrome that absorbs red light having a light emission peak wavelength at around 660 nm, and a far-red light-absorbing (Pfr-type) phytochrome having a light emission peak wavelength at around 730 nm. The red light-absorbing (Pr-type) phytochrome is an inactive type, and the far-red light-absorbing (Pfr-type) phytochrome is an active type, and through reciprocal change between these two conformations, the molecular functions of phytochrome are reversibly converted by red light and far-red light to cause various photoresponses to promote various kinds of plant photomorphogenesis such as induction of seed germination, cotyledon development and stem elongation.

As described above, the index of energy to be radiated from a light source for plant cultivation is expressed by a photon flux. The index of light quantity to be radiated to plants is expressed by a photon flux density. The photon flux density ($\mu mol \cdot m^{-2} \cdot s^{-1}$) is a number of photons to reach a unit area per unit time. The level of red light and far-red light acting for plant photomorphogenesis depends on the number of photons. The energy amount of a photon varies in reverse proportion to the wavelength thereof. When Planck constant ($6.63 \times 10^{-34}$ Js) is represented by h, light speed is by c ($3 \times 10^8$ m/s), and wavelength is by $\lambda$(m), the photon energy e is expressed by an expression of $e = hc/\lambda$.

In the light emitting device the ratio R/B is in a range of more than 4 and 50 or less, wherein the ratio R/B is the ratio of the photon flux R of red light to the photon flux B of blue light. In the light emitting device, the ratio R/Fr is in a range of 0.1 or more and 10 or less, wherein the ratio R/Fr is the ratio of the photon flux R of red light to the photon flux Fr of far-red light. When the range of the ratio R/B of light emitted from the light emitting device and the range of the ratio R/Fr thereof each fall within the above range, red light and far-red light can be absorbed by the two photoreceptors of red light-absorbing (Pr-type) phytochrome and far-red light-absorbing (Pfr-type) phytochrome contained in a plant to cause photoresponses by the light emitted from the light emitting device. Then, by the light emitted from the light emitting device, photomorphogenesis of the plant irradiated with the light is promoted and plant growth is thereby promoted. When the ratio R/Fr of light emitted from the light emitting device falls within the above range, a plant having received the light from the light emitting device is to be irradiated with light falling within a red region and also light falling within a far-red region of 700 nm or more. In the plant irradiated with light from the light emitting device, photosynthesis is activated due to the synergistic effect (Emmerson effect) of the two types of light, the light in a red region and the light in a far-red region, and the plant cultivation is thereby promoted.

The ratio R/B of the light emitted from the light emitting device is preferably 5 or more and 48 or less, more preferably 6 or more and 45 or less, even more preferably 7 or more and 40 or less, further more preferably more than 8 and 38 or less, and especially preferably more than 10 and 38 or less. The ratio of R/B is the ratio of the photon flux R of red light to the photon flux B of blue light of the light emitted from the light emitting device. When the ratio R/B of light emitted from the right emitting device falls within the above range, the light emitted from the light emitting device can be efficiently absorbed by the photoreceptors of the plant to undergo photomorphogenesis, The ratio R/Fr of the light emitted from the light emitting device is preferably 0.2 or more and 8 or less, more preferably 0.3 or more and 7 or less, even more preferably 0.4 or more and 6 or less, further more preferably 0.5 or more and 5 or less, still further more preferably 1.5 or more and 4.2 or less, still further more preferably 1.5 or more and 4.12 or less, and especially preferably 1.5 or more and 4.0 or less. The ratio R/Fr is the ratio R/Fr is the ratio of the photon flux R of red light to the photon flux Fr of far-red light of the light emitted from the light emitting device. When the ratio R/Fr of light emitted from the right emitting device falls within the above range, the light emitted from the light emitting device can be efficiently absorbed by the photoreceptors of the plant to undergo photomorphogenesis.

The photon flux ($\mu mol \cdot s^{-1}$ or $mol \cdot s^{-1}$) can be converted from a radiation flux (W). The relation between the radiation flux and the photon flux is represented by the following equation (1).

Radiation Flux ($W$)=photon flux ($mol \cdot s^{-1}$)×Avogadro number ($mol^{-1}$)×Planck constant (Js)×light speed ($m \cdot s^{-1}$)÷wavelength ($m$)   (1)

From the radiation flux (W) obtained from the light emitting device and on the basis of the above-mentioned equation (1), the photon flux is converted. The photon flux in a wavelength range of 400 nm to 490 nm is integrated to calculate the photon flux B of blue light. The photon flux in a wavelength range of 620 nm or more and less than 700 nm obtained from the light emitting device is integrated to calculate the photon flux R of red light. The photon flux in a wavelength range of 700 nm or more and 780 nm or less obtained from the light emitting device is integrated to calculate the photon flux Fr of far-red light.

Light Emitting Element

The light emitting element is used as an excitation light source and emits light having a light emission peak wavelength in a wavelength range of 380 nm or more and 490 nm or less.

More preferably, the light emission peak wavelength of the light emitting element falls within a wavelength of 390 nm or more and 480 nm or less, even more preferably 420 nm or more and 470 nm or less, even more preferably 440 nm or more and 460 nm or less, and especially preferably 445 nm or more and 455 nm or less. As the light emitting element of the type, preferred is use of a light emitting element containing a nitride semiconductor ($In_XAl_YGa_{1-X-Y}N$, $0 \leq X$, $0 \leq Y$, $X+Y \leq 1$). The full width at half maximum of the emission spectrum of the light emitting element may be, for example, 30 nm or less.

The light emitting device provided with a first fluorescent material which is excited by the light from the light emitting element to emit light having at least one light emission peak wavelength in a wavelength range of 580 nm or more and less than 680, and a second fluorescent material which is excited by the light from the light emitting element to emit light having at least one light emission peak wavelength in a wavelength range of 680 nm or more and 800 nm or less. For convenience sake, the second fluorescent material and the first fluorescent materials are described in that order.

Second Fluorescent Material

The second fluorescent material is excited by the light from the light emitting element to emit light having at least one light emission peak wavelength in a wavelength range of 680 nm or more and 800 nm or less.

The second fluorescent material includes at least one fluorescent material selected from a first aluminate fluorescent material having a composition containing Al and Cr, and a second aluminate fluorescent material having a composition containing a first element Ln containing at least one element selected from the group consisting of rare earth elements except Ce, and Al, and optionally a second element M containing at least one element selected from the group consisting of Ga and In, and Ce, and Cr, and when the molar composition ratio of the total of Al and the second element M is taken as 5, the molar composition ratio of Ce is a product of a value of parameter x and 3, the molar composition ratio of Cr is a product of a value of parameter y and 3, the value of parameter x is in a range of exceeding 0.0002 and less than 0.50, and the value of parameter y is in a range of exceeding 0.0001 and less than 0.05.

In the first aluminate fluorescent material, Cr is an activator element. In the second aluminate fluorescent material, Ce and Cr are activator elements. In the composition of the second aluminate fluorescent material, when the molar composition ratio of the total of Al and the second element M is taken as 5, the molar composition ratio of Ce is the product of the value of parameter value x and 3, and when the molar composition ratio of Cr is a product of the value of parameter y and 3, the value of parameter x is in a range of exceeding 0.0002 and less than 0.50 ($0.0002<x<0.50$), and the value of parameter y is in the range of exceeding 0.0001 and less than 0.05 ($0.0001<y<0.05$). In that condition, the activation amount of Ce and the activation amount of Cr that are to be light emission centers contained in the crystal structure of the second aluminate fluorescent material each can be within an optimum range to thereby prevent reduction in the light emission intensity. The second aluminate fluorescent material can be prevented reduction in the light emission intensity due to be caused by reduction in the light emission centers. And light emission concentration quenching in the second aluminate fluorescent material caused by increase in the activation amounts can be prevented . And accordingly, the light emission intensity of the second aluminate fluorescent material can be thereby increased.

Preferably, the second fluorescent material contains at least one fluorescent material selected from the group consisting of a first aluminate fluorescent material having a composition represented by the following formula (I) and a second aluminate fluorescent material having a composition represented by the following formula (II).

$(Al_{1-w}Cr_w)_2O_3$   (I)

wherein w satisfies $0<w<1$.

$(Ln_{1-x-y}Ce_xCr_y)_3(Al_{1-z}M_z)_5O_{12}$   (II)

wherein Ln represents at least one rare earth element selected from the group consisting of rare earth elements except Ce, M represents at least one element selected from the group consisting of Ga and In, x, y and z each satisfy $0.0002<x<0.50$, $0.0001<y<0.05$, and $0 \leq z \leq 0.8$.

The second fluorescent material contains at least one aluminate fluorescent material and may contain two or more kinds of aluminate fluorescent materials. Cr contained in the first aluminate fluorescent material having a composition represented by the above-mentioned formula (I) is an activator element. In the formula (I), the product of the value of parameter w and 2 corresponds to the molar composition ratio of the activator element Cr in the composition represented by the formula (I). The value of parameter w is preferably $0<w<1$, more preferably $0.00005 \leq w \leq 0.25$, even more preferably $0.0005 \leq w \leq 0.15$, and even more preferably $0.001 \leq w \leq 0.07$. When the value of parameter w is more than 0 and less than 1, the composition contains the activator element Cr that is to be the light emission center to increase the light emission intensity.

Ce and Cr in the formula (II) are activator elements of the second aluminate fluorescent material having a composition represented by the formula (II). In the formula (II), the product of the value of parameter x and 3 corresponds to the molar composition ratio of the activator element Ce in the composition represented by the formula (II). The value of parameter x is preferably $0.0002<x<0.50$, more preferably $0.001 \leq x \leq 0.35$, and even more preferably $0.0015 \leq x \leq 0.30$. In the formula (II), the product of the value of parameter y and 3 corresponds to the molar composition ratio of the activator element Cr in the composition represented by the formula (II). The parameter value y is preferably $0.0001<y<0.05$, more preferably $0.0005 \leq y \leq 0.04$, and even more preferably $0.001 \leq y \leq 0.026$.

In the formula (II), Ln is at least one rare earth element selected from the group consisting of rare earth elements except Ce, more preferably at least one selected from the group consisting of Y, Gd, Lu, La, Tb and Pr, and even more preferably at least one selected from the group consisting of Y, Gd and Lu.

In the formula (II), M is preferably at least one element selected from the group consisting of Ga and In, and more preferably, M contains Ga. In the formula (II), the product of the value of parameter z and 5 corresponds to the molar composition ratio of the element M to substitute for Al. In the formula (II), the value of parameter z is preferably $0 \leq z \leq 0.8$, more preferably $0.001 \leq z \leq 0.6$, and even more preferably $0.01 \leq z \leq 0.4$.

At least one aluminate fluorescent material contained in the second fluorescent material has a composition constituting a garnet structure, and is therefore resistant to heat, light and water. The absorption peak wavelength of the excited absorption spectrum of at least one aluminate fluorescent material contained in the second fluorescent material is 420 nm or more and around 470 nm, and the material can sufficiently absorb the light from the light emitting element to enhance the light emission intensity from the second fluorescent material. Specific examples of at least one aluminate fluorescent material contained in the second fluorescent material include $(Al_{0.09}Cr_{0.01})_2O_3$, $(Al_{0.9943}Cr_{0.0057})_2O_3$, $(Y_{0.977}Ce_{0.009}Cr_{0.014})_3Al_5O_{12}$, $(Lu_{0.983}Ce_{0.009}Cr_{0.008})_3Al_5O_{12}$, $(Lu_{0.9725}Ce_{0.0175}Cr_{0.01})_3Al_5O_{12}$, $(Y_{0.9735}Ce_{0.0125}Cr_{0.014})_3(Al_{0.8}Ga_{0.2})_5O_{12}$, $(Y_{0.7836}Gd_{0.1959}Ce_{0.0125}Cr_{0.008})_3Al_5O_{12}$, and $(Gd_{0.9675}Ce_{0.0125}Cr_{0.02})_3Al_5O_{12}$.

Production Method for Second Fluorescent Material

One example of a method for producing at least one aluminate fluorescent material contained in the second fluorescent material is described.

Raw materials of a compound containing at least one rare earth element Ln selected from rare earth elements except Ce, a compound containing Al, optionally a compound containing at least one element M selected from the group containing Ga and In, a compound containing Ce, and a compound containing Cr are weighed in such a manner that, based on the molar composition ratio, 5, of the total of Al and the element M, when the total molar composition ratio of the rare earth element Ln, and Ce and Cr is 3, the molar composition ratio of Ce is a product of a value of parameter x and 3, the molar composition ratio of Cr is a product of a value of parameter y and 3, then the value of parameter x may be in a range of exceeding 0.0002 and less than 0.50, and the value of parameter y may be in a range of exceeding 0.0001 and less than 0.05. In the case where the molar composition ratio of the element M is a product of a value of parameter z and 5, the compound containing the element M is preferably so weighed that the value of parameter value z may be 0 or more and 0.8 or less. The raw materials are mixed to give a raw material mixture. The raw material mixture is heat-treated, and thereafter optionally subjected to solid-liquid separation by washing or filtration, dried according to a method of vacuum drying, and then post-treated through classification by dry sieving to give a second aluminate fluorescent material. Regarding the production method for the second aluminate fluorescent material, the present applicant's prior patent application, Japanese Patent Application No. 2014-260421 may be referred to.

The compounds to be the raw materials include oxides, hydroxides, nitrides, oxynitrides, fluorides, and chlorides. These compounds may be hydrates. The compounds are preferably oxides not containing any other element than the targeted composition and capable of giving a fluorescent material having an intended composition with ease, as compared with any other materials. Specifically, such compounds include $Y_2O_3$, $Gd_2O_3$, $Lu_2O_3$, $La_2O_3$, $Tb_4O_7$, $Pr_6O_{11}$, $Al_2O_3$, $Ga_2O_3$, $In_2O_3$, $CeO_2$, and $Cr_2O_3$. The raw material mixture may optionally contain a flux such as halide. When the raw material mixture contains a flux, the reaction between the raw materials can be promoted and the solid-phase reaction can run on more uniformly. Specific examples of the flux include $BaF_2$ and $CaF_2$. $BaF_2$ is preferred. This is because, when barium fluoride is used as the flux, it can stabilize a garnet crystal structure and the material can readily have a garnet crystal structure.

The temperature for heat treatment is, from the viewpoint of stability of the crystal structure, preferably in a range of 1000° C. or higher and 2100° C. or lower. The heat treatment time varies depending on the heating rate and the heat treatment atmosphere and is preferably in a range of 1 hour or more and 20 hours or less after reach to the heat treatment temperature. The atmosphere where the raw material mixture is heat-treated may be an inert atmosphere of argon or nitrogen, or a reductive atmosphere containing hydrogen, or an oxidative atmosphere such as air.

First Florescent Material

The first fluorescent material is excited by the light from the light emitting element to emit light having at least one light emission peak wavelength in a wavelength range of 580 nm or more and less than 680 nm.

Preferably, the first fluorescent material contains at least one fluorescent material selected from the group consisting of an $Eu^{2+}$-activated nitride fluorescent material, an $Mn^{4+}$-activated fluorogermanate fluorescent material, an $Eu^{2+}$-activated alkaline earth metal sulfide fluorescent material and an $Mn^{4+}$-activated halide fluorescent material. One kind of a fluorescent material may be used singly, or two or more kinds of fluorescent materials may be used in combination in the first fluorescent material. Preferably, for example, the first fluorescent material contains at least one fluorescent material selected from the group consisting of fluorescent materials having any of the compositions represented by the following formulae (III) to (VIII).

Preferably, the first fluorescent material contains a nitride fluorescent material having a composition containing at least one element selected from Sr and Ca, and Eu, and Al, and Si. Examples of the first fluorescent material include nitride fluorescent materials having a compositional formula represented by $(Sr,Ca)AlSiN_3:Eu$. In this description, plural elements described in the compositional formula, as sectioned by comma (,) therein, mean that the composition contains at least one element among these plural elements. Plural elements described in the compositional formula, as sectioned by comma (,), mean that the composition contains at least one element selected from the plural elements sectioned by comma in the composition, and may contain two or more kinds of elements selected from those plural elements.

Preferably, the first fluorescent material contains a nitride fluorescent material having a composition represented by the following formula (III).

$$(Ca_{1-p-q}Sr_pEu_q)AlSiN_3 \quad (III)$$

wherein p and q each satisfy $0 \leq p \leq 1.0$, $0 < q < 0.5$, $0 < p+q \leq 1.0$.

In the formula (III), Eu represents an activator element of the nitride fluorescent material. In the formula (III), the value of parameter q is the molar composition ratio of the activator element Eu in the composition represented by the formula (III). The value of parameter q is preferably $0.0001 \leq q \leq 0.4$, more preferably $0.001 \leq q \leq 0.3$, and even more preferably $0.0015 \leq q \leq 0.2$. In the formula (III), the value of parameter p is the molar composition ratio of Sr in the composition represented by the formula (III). The value of parameter p is preferably $0.001 \leq p < 0.9$, more preferably $0.002 \leq p \leq 0.8$, and even more preferably $0.003 \leq p \leq 0.76$.

The first fluorescent material may contain an $Eu^{2+}$-activated nitride fluorescent material that differs from the nitride fluorescent material having a composition represented by the above-mentioned formula (III).

The $Eu^{2+}$-activated nitride fluorescent material includes a nitride fluorescent material having a composition containing at least one element selected from Sr and Ca, and Eu, Al and Si, and in addition thereto, a fluorescent material having a composition containing at least one element selected from the group consisting of alkaline earth metal elements and at least one element selected from the group consisting of alkali metal elements and containing an $Eu^{2+}$-activated aluminum nitride.

Preferably, the $Mn^{4+}$-activated halide fluorescent material is a fluorescent material having a composition containing at least one element or ion selected from the group consisting of alkali metal elements and ammonium ion ($NH_4^+$) and at least one element selected from the group consisting of Group 4 elements and Group 14 elements and containing an $Mn^{4+}$-activated fluoride.

The first fluorescent material may contain at least one fluorescent material selected from the group consisting of fluorescent materials having any of the compositions represented by the following formulae (IV) to (VIII).

$$(i-j)MgO \cdot (j/2)Sc_2O_3 \cdot kMgF_2 \cdot mCaF_2 \cdot (1-n)GeO_2 \cdot (n/2)M^1O_3 : vMn^{4+} \quad (IV)$$

wherein $M^1$ represents at least one selected from the group consisting of Al, Ga and In, j, k, m, n and v each satisfy $2 \leq i \leq 4$, $0 \leq j < 0.5$, $0 < k < 1.5$, $0 \leq m < 1.5$, $0 < n < 0.5$, and $0 < v < 0.05$.

$$M^2_dM^3_eM^4_fAl_{3-g}Si_gN_h \quad (V)$$

wherein $M^2$ represents at least one element selected from the group consisting of Ca, Sr, Ba and Mg, $M^3$ represents at least one element selected from the group consisting of Li, Na and K, $M^4$ represents at least one element selected from the group consisting of Eu, Ce, Tb and Mn, d, e, f, g and h each satisfy $0.80 \leq d \leq 1.05$, $0.80 \leq e \leq 1.05$, $0.001 < f \leq 0.1$, $0 \leq g \leq 0.5$, and $3.0 \leq h \leq 5.0$.

$$(Ca_{1-r-s-t}Sr_rBa_sEu_t)_2Si_5N_8 \quad (VI)$$

wherein r, s and t each satisfy $0 \leq r \leq 1.0$, $0 \leq s \leq 1.0$, $0 < t < 1.0$ and $r+s+t \leq 1.0$.

$$(Ca,Sr)S:Eu \quad (VII)$$

$$A_2[M^5_{1-u}Mn^{4+}_uF_6] \quad (VIII)$$

wherein A represents at least one selected from the group consisting of K, Li, Na, Rb, Cs and $NH_4^+$, $M^5$ represents at least one element selected from the group of Group 4 elements and Group 14 elements, and u satisfies $0 < u < 0.2$.

Mass Ratio of First Fluorescent Material and Second Fluorescent Material

The ratio by mass of the second fluorescent material relative to 100% by mass of the total amount of the first fluorescent material and the second fluorescent material is such that the ratio R/B of the light emitted from the light emitting device is in a range of more than 4 and 50 or less, and is such that the ratio R/Fr of the light emitted from the light emitting device is in a range of 0.1 or more and 10 or less. The light emitted from the light emitting device is a mixed light including the light emitted from the first fluorescent material and the second fluorescent material exited by the light from the light emitting element. The ratio R/B of the light emitted from the light emitting device is the ratio of the photon flux R of the red light to the photon flux B of the blue light, and the ratio R/Fr of the light emitted from the light emitting device is the ratio of the photon flux R of red light to the photon flux Fr of far-red light. Preferably, the ratio by mass of the second fluorescent material relative to 100% by mass of the total amount of the first fluorescent material and the second fluorescent material falls within a range of 0.5% by mass or more and 99.5% by mass or less, more preferably 1% by mass or more and 99% by mass or less, even more preferably 1% by mass or more and 90% by mass or less, still more preferably 2% by mass or more and 80% by mass or less, further more preferably 5% by mass or more and 78% by mass or less, and especially preferably more than 10% by mass and 75% by mass or less. When the ratio by mass of the second fluorescent material relative to 100% by mass of the total of the first fluorescent material and the second fluorescent material falls within the above-mentioned ranges, the light from the light emitting element having a light emission peak wavelength in a wavelength range of 380 nm or more and 490 nm or less and the light emitted from the first fluorescent material and the second fluorescent material excited by the light from the light emitting element can control the mixed color to emit the light in such a manner that the ratio R/B is more than 4 and 50 or less and the ratio R/Fr is 0.1 or more and 10 or less. When the ratio by mass of the second fluorescent material relative to 100% by mass of the total amount of the first fluorescent material and the second fluorescent material falls within a range of 2% by mass or more and 80% by mass or less, the ratio R/B can be more than 10 and 38 or less, and the ratio R/Fr can be 1.5 or more and 4.12 or less, and accordingly, a light emitting device that emits light capable of being more readily absorbed by the photoreceptors of plants and capable of more efficiently promoting photomorphogenesis can be provided. When the ratio by mass of the second fluorescent material relative to 100% by mass of the total amount of the first fluorescent material and the second fluorescent material falls within a range of more than 10% by mass and 75% by mass or less, the ratio R/B can be more than 10 and 38 or less, and the ratio R/Fr can be 1.5 or more and 4.0 or less, and accordingly, a light emitting device that emits light capable of being more readily absorbed by the photoreceptors of plants and capable of more efficiently promoting photomorphogenesis can be provided.

Fluorescent Member

The fluorescent member includes a fluorescent material containing the first fluorescent material and the second fluorescent material, and a resin. As shown in FIG. 1, the fluorescent member 50 functions not only for wavelength conversion of the light emitted by the light emitting element 10 but also as a member for protecting the light emitting element 10 from the external environment. The fluorescent material 70 in the fluorescent member 50 contains the first fluorescent material 71 and the second fluorescent material 72.

The fluorescent member 50 that includes the fluorescent material 70 is formed so as to cover the light emitting element 10 arranged inside the depression of the molded body 40. In consideration of easiness in production, the resin included in the fluorescent member 50 may be a silicone resin, an epoxy resin, or a modified silicone resin such as an epoxy-modified silicone resin. In FIG. 1, the fluorescent material 70 exists in the fluorescent member 50 in such a manner that the first fluorescent material 71 and the second florescent material 72 are mixed therein, and the composition for the fluorescent member is arranged to cover the light emitting element 10 to constitute the fluorescent member. Accordingly, the light from the light emitting element 10 can be efficiently subjected to wavelength conversion in the fluorescent material 70, and a light emitting device excellent in light emission efficiency can be thus provided. The arrangement of the fluorescent member 50 including the fluorescent material 70 and the light emitting element 10 is not limited to the embodiment where the fluorescent material 70 is arranged near the light emitting element 10 as in FIG. 1. In consideration of the influence of heat generated by the light emitting element 10, the fluorescent material 70 may be spaced from the light emitting element 10 in the fluorescent member 50. As the case may be, the fluorescent material 70 may be arranged almost evenly in the fluorescent material 50 so that the light emitting device 100 can emit light free from color unevenness. In FIG. 1, the fluorescent material 70 is so arranged that the first fluorescent material 71 and the second fluorescent material 72 are mixed therein, but not limited thereto, for example, the fluorescent member 50 may be divided into plural parts, and the part mainly containing the second fluorescent material 72 may be arranged above the part mainly including the first fluorescent material 71, and the two may be transposed.

Preferably, the fluorescent member includes the first fluorescent material and the second fluorescent material in a total amount of 50 parts by mass or more and 150 parts by mass or less relative to 100 parts by mass of the resin therein. When the total amount of the first fluorescent material and the second fluorescent material relative to the resin in the fluorescent member falls within the above range, the light emitted from the light emitting element can be efficiently subjected to wavelength conversion, and the light emitting device can therefore emit red light and far-red light falling within a wavelength range that can be well absorbed by plant photoreceptors of red light-absorbing (Pr-type) phytochrome and far red light-absorbing (Pfr-type) phytochrome to cause plant photomorphogenesis.

The total amount of the first fluorescent material and the second fluorescent material in the fluorescent member is more preferably 10 parts by mass or more and 140 parts by mass or less relative to 100 parts by mass of the resin contained in the fluorescent member, even more preferably 15 parts by mass or more and 120 parts by mass or less, and further more preferably 20 parts by mass or more and 100 parts by mass or less.

The fluorescent member includes the second fluorescent material in an amount of 0.5 parts by mass or more and 100 parts by mass or less relative to 100 parts by mass of the resin therein. When the content of the second fluorescent material relative to the resin in the fluorescent member falls within the above range, the light emitting device can emit light whose ratio R/B is more than 4 and 50 or less and whose ratio R/Fr is 0.1 or more and 10 or less. Such light can promote plant photomorphogenesis.

The content of the second fluorescent material in the fluorescent member is more preferably 1 part by mass or more and 95 parts by mass or less relative to 100 parts by mass of the resin in the fluorescent member, even more preferably 2 parts by mass or more and 90 parts by mass or less, and further more preferably 3 parts by mass or more and 80 parts by mass or less.

The content of the first fluorescent material in the fluorescent member is not specifically limited so far as the ratio R/B of the photon flux R of red light to the photon flux B of blue light, of the light emitted from the light emitting device provided with the fluorescent member is more than 4 and 50 or less and the ratio R/Fr of the photon flux R of red light to the photon flux Fr of far-red light, is 0.1 or more and 10 or less. The content of the first fluorescent material in the fluorescent member is, for example, 1 part by mass or more relative to 100 parts by mass of the resin in the fluorescent member, preferably 5 parts by mass or more, more preferably 10 parts by mass or more, even more preferably 15 parts by mass or more, and is preferably 149 parts by mass or less, more preferably 140 parts by mass or less, even more preferably 100 parts by mass or less. When the content of the first fluorescent material in the fluorescent member falls within the above range, the light emitted from the light emitting element can be efficiently subjected to wavelength conversion by the first fluorescent material and the light emitting device can therefore emit light capable of promoting plant photomorphogenesis.

The fluorescent member can contain any other components such as a filler, a light stabilizer and a colorant, in addition to the first fluorescent material, the second fluorescent material and the resin therein. Examples of the filler include silica, barium titanate, titanium oxide, and aluminum oxide. The amount of the other components to be contained in the fluorescent member is preferably 0.01 parts by mass or more and 20 parts by mass or less relative to 100 parts by mass of the resin contained in the fluorescent member.

Other Fluorescent Materials

The fluorescent member may contain any other type of fluorescent material except the first fluorescent material and the second fluorescent material, so far as the light emitted from the light emitting device is such that the ratio R/B of the photon flux R of red light to the photon flux B of blue light, is more than 4 and 50 or less and the ratio R/Fr of the photon flux R of red light to the photon flux Fr of far-red light, is 0.1 or more and 10 or less.

The other fluorescent materials include a green fluorescent material that absorbs a part of light emitted from the light emitting element to emit green light, a yellow fluorescent material to emit yellow light, and a fluorescent material having a light emission peak wavelength in a wavelength range of more than 680 nm.

Specifically, the green fluorescent material includes fluorescent materials having a composition represented by any of the following formulae (i) to (iii).

$$M^{11}{}_{8}MgSi_{4}O_{16}X^{11}:Eu \qquad (i)$$

wherein M¹¹ represents at least one selected from the group consisting of Ca, Sr, Ba and Zn, and X¹¹ represents at least one selected from the group consisting of F, Cl, Br and I.

$$Si_{6-a}Al_aO_aN_{8-a}:Eu \quad (ii)$$

wherein a satisfies 0<a<4.2.

$$M^{13}Ga_2S_4:Eu \quad (iii)$$

wherein M¹³ represents at least one selected from the group consisting of Mg, Ca, Sr and Ba.

Specifically, the yellow fluorescent material includes fluorescent materials having a composition represented by any of the following formulae (iv) to (v).

$$M^{14}{}_{b/c}Si_{12-(b+c)}Al_{(b+c)}O_cN_{(16-c)}:Eu \quad (iv)$$

wherein M¹⁴ represents at least one selected from the group consisting of Sr, Ca, Li and Y, b is 0.5 to 5, c is 0 to 2.5, and c is a charge of M¹⁴.

$$M^{15}{}_3Al_5O_{12}:Ce \quad (v)$$

wherein M¹⁵ represents at least one selected from the group consisting of Y, Lu, Tb and Gd, and a part of Al may be substituted with Ga.

Specifically, the fluorescent material having a light emission peak wavelength in a wavelength range of more than 680 nm includes fluorescent materials having a composition represented by any of the following formulae (vi) to (ix).

$$(Ca, Sr, Ba)(Y, Gd, La)(Al, Ga)_{1-a1}Mg_{a1}O_4:Mn \quad (0 \leq a1 \leq 0.2) \quad (vi)$$

$$Li(Al, Ga)O_2:Fe \quad (vii)$$

$$CdS:Fe \quad (viii)$$

$$(Gd, Y, La, Tb)(Al, Sc, Ga)O_3:Cr \quad (ix)$$

Composition for Fluorescent Member

The composition contains the first fluorescent material and the second fluorescent material in a total amount of 5 parts by mass or more and 150 parts by mass or less relative to 100 parts by mass of the resin therein. In the composition, the ratio by mass of the second fluorescent material to the total amount of the first fluorescent material and the second fluorescent material is such that the ratio R/B of the photon flux R of red light to the photon flux B of blue light, of a mixed light of the light emitted from the first fluorescent material and the second fluorescent material exited by the light from the light emitting element and the light from the light emitting element is more than 4 and 50 or less, and is such that the ratio R/Fr of the photon flux R of red light to the photon flux Fr of far-red light, is 0.1 or more and 10 or less. Preferably, the ratio by mass of the second fluorescent material relative to 100% by mass of the total amount of the first fluorescent material and the second fluorescent material contained in the composition falls within a range of 0.5% by mass or more and 99.5% by mass or less, more preferably 1% by mass or more and 99% by mass or less, even more preferably 1% by mass or more and 90% by mass or less, still more preferably 2% by mass or more and 80% by mass or less, further more preferably 5% by mass or more and 78% by mass or less, and especially preferably more than 10% by mass and 75% by mass or less. When the ratio by mass of the second fluorescent material relative to the total of the first fluorescent material and the second fluorescent material contained in the composition falls within the above-mentioned range, the light from the light emitting element having a light emission peak wavelength in a wavelength range of 380 nm or more and 490 nm or less and the light emitted from the first fluorescent material and the second fluorescent material excited by the light from the light emitting element can control the mixed color to emit the light in such a manner that the ratio R/B of the photon flux R of red light to the photon flux B of blue light, is more than 4 and 50 or less and the ratio R/Fr of the photon flux R of red light to the photon flux Fr to far-red light, is 0.1 or more and 10 or less. When the ratio by mass of the second fluorescent material relative to 100% by mass of the total amount of the first fluorescent material and the second fluorescent material falls within a range of 2% by mass or more and 80% by mass or less, the ratio R/B of the photon flux R of red light to the photon flux B of blue light, can be more than 10 and 38 or less, and the ratio R/Fr of the photon flux R of red light to the photon flux Fr of far-red light, can be 1.5 or more and 4.12 or less, and accordingly, a light emitting device that emits light capable of being more readily absorbed by the photoreceptors of plants and capable of more efficiently promoting photomorphogenesis can be provided. When the ratio by mass of the second fluorescent material relative to 100% by mass of the total amount of the first fluorescent material and the second fluorescent material falls within a range of more than 10% by mass and 75% by mass or less, the ratio R/B of the photon flux R of red light to the photon flux B of blue light, can be more than 10 and 38 or less, and the ratio R/Fr of the photon flux R of red light to the photon flux Fr of far-red light, can be 1.5 or more and 4.0 or less, and accordingly, a light emitting device that emits light capable of being more readily absorbed by the photoreceptors of plants and capable of more efficiently promoting photomorphogenesis can be provided.

The light emitted from the light emitting device can be readily absorbed by plant photoreceptors to carry out photomorphogenesis, and can promote plant photomorphogenesis and can therefore promote plant cultivation. Preferably, the light emitting device is used in combination with a light source to emit white light. White light can be readily absorbed by plant photoreceptors to carry out photosynthesis such as plant chlorophyll. For example, when a light source to emit white light and the light emitting device of the first aspect of the present invention are combined and used, plant photosynthesis may be activated and plant photomorphogenesis may be promoted more, and plant cultivation may be promoted more. Examples of the white light include sunlight, and light emitted from various lamps. As the light source to emit white light, for example, at least one light source selected from sun, fluorescent lamps, incandescent lamps, metal halide lamps, high-pressure sodium lamps and LED lamps can be used.

When combined with a light source to emit white light, the light emitting device can be used as a light emitting device for light supplement to promote plant growth. In the case where the light emitting device is used as combined with a light source to emit white light, the ratio R/B of the photon flux R of red light to the photon flux B of blue light of the mixed light of the light emitted by the light emitting device and the white light emitted from the light source, may be preferably 1.0 or more and 10 or less, more preferably 1.5 or more and 8 or less, even more preferably 2.0 or more and 6 or less. In the case, the ratio R/Fr of the photon flux R of red light to the photon flux Fr of far-red light of the mixed light of the light emitted by the light emitting device and the white light emitted from the light source, may be preferably 0.1 or more and 10 or less, more preferably 0.2 or more and 8 or less, even more preferably 0.3 or more and 7 or less, further more preferably 0.4 or more and 6 or less, and especially preferably 0.5 or more and 5 or less.

Illumination Device

The light emitting device may be combined with a light source to emit a light energy differing from that from the light emitting device to constitute an illumination device. The light source to emit a light energy differing from that from the light emitting device may be a light source to emit white light. The light source may also be one to emit any other light than white light. For example, the light source may be one to emit blue light. An illumination device including a combination of the light emitting device and a light source to emit a light energy differing from that from the light emitting device can radiate an optimum light energy to plants depending on the degree of plant growth.

Plant Cultivation Method

The plant cultivation method of one embodiment of the present disclosure is a method of cultivating plants comprising radiating the light emitted from the light emitting device to plants. According to the plant cultivation method, the light from the light emitting device 100 can be radiated to plants in plant factories that are isolated from external environments and are artificially controllable. For plants cultivated in plastic greenhouses utilizing sunlight, the light emitting device may be used as light supplement for sunlight, and the light from the light emitting device can be radiated to plants. The kinds of plants are not specifically limited. The light emitting device can emit light capable of activating plant photosynthesis and capable of being readily absorbed by plant photoreceptors to carry out photomorphogenesis, and can therefore promote plant cultivation so that the stems, leaves, roots and fruits of the cultivated plants can have good morphology and weight. Accordingly, the plant cultivation method is favorably applied to cultivation of vegetables, and flowers. The vegetables include lettuces such as leaf lettuce, garden lettuce, curled lettuce, Lamb's lettuce, romaine lettuce, endive, lollo rosso, rucola lettuce, curly lettuce, green leaf, and Korean lettuce; Asteracea plants such as garland chrysanthemum; vegetables of Convolvulaceae such as spinach; vegetables of Rosaceae such as strawberry; and flowers such as chrysanthemum, gerbera, rose, and tulip.

EXAMPLES

Hereinunder the present invention is described more specifically with reference to Examples. The present invention is not limited to these Examples.

Examples 1 to 5 and Comparative Example 1

First Fluorescent Material

As the first fluorescent material, used here was $CaAlSiN_3$:Eu (hereinunder this may be referred to as "670CASN") having a light emission peak wavelength at 670 nm as excited by the light from a light emitting element having a light emission peak wavelength at 450 nm.

Second Fluorescent Material

As the second fluorescent material, a fluorescent material obtained according to the following production method was used.

As raw materials, $Y_2O_3$, $CeO_2$, $Cr_2O_3$, and $Al_{23}$ were used. These were weighed at a desired charge-in composition ratio. As a flux, $BaF_2$ was added thereto in an amount of 5 parts by mass relative to 100 parts by mass of the total amount of the raw materials not containing a flux, and dry-mixed in a ball mill for 1 hour to prepare a raw material mixture. The resultant raw material mixture was charged in an alumina crucible, covered with a lid, and heat-treated in a reductive atmosphere of 3 vol % $H_2$ and 97 vol % $N_2$ at 1500° C. for 10 hours to give a calcined product. The calcined product was led to pass through a dry sieve to give a second fluorescent material. The resultant second fluorescent material was analyzed through ICP-AES spectrometry using an inductively coupled plasma spectrometer (by Perkin Elmer) for composition analysis. The composition of the resultant second fluorescent material was $Y_{0.977}Ce_{0.009}Cr_{0.014})_3Al_5O_{12}$ (hereinafter this may be referred to as "YAG:Ce,Cr"). The second fluorescent material has a light emission peak wavelength of 707 nm, as excited by the light from a light emitting element having a light emission peak wavelength at 450 nm.

Light Emitting Device

A light emitting device was produced in the same manner as that for the light emitting device shown in FIG. 1.

In the light emitting device 100, a nitride semiconductor having a light emission peak wavelength at 450 nm was used as the light emitting element 10.

As the resin to constitute the fluorescent member 50, a silicone resin was used. To 100 parts by mass of the silicone resin, added were the first fluorescent material 71 and the second fluorescent material 72 at a blending ratio (part by mass) shown in Table 1, then dispersed, and defoamed to give a resin composition to constitute a fluorescent member. In the resin compositions of Examples 1 to 5, the blending ratio (part by mass) of the first fluorescent material 71 and the second fluorescent material 72 was controlled as in Table 1. The resin composition was cast onto the light emitting element 10 in depression of the molded body 40, then filled into the depression, heated at 150° C. for 4 hours to cure the resin composition, thereby forming the fluorescent member 50. In each of Examples 1 to 5, the light emitting device 100 as shown in FIG. 1 was produced. In Comparative Example 1, a light emitting device was produced using a resin composition including the first fluorescent material alone but not using the second fluorescent material in the fluorescent member. In the resultant light emitting devices, the ratio by mass (% by mass) of the first fluorescent material 71 and the ratio by mass (% by mass) of the second fluorescent material 72 relative to 100% by mass of the total amount of the first fluorescent material 71 and the second fluorescent material 72 are shown in Table 1.

Examples 6 to 10 and Comparative Example 2

In Examples 6 to 10 and Comparative Example 2, $CaAlSiN_3$:Eu (hereinafter this may be referred to as "660CASN") having a light emission peak wavelength at 660 nm as excited by the light from a light emitting element having a light emission peak wavelength at 450 nm was used as the first fluorescent material. In Examples 6 to 10, a light emitting device was produced in the same manner as in Example 1, except that the first fluorescent material prepared herein and the same second fluorescent material as in Example 1 were used in the blending ratio (part by mass) shown in Table 2. In Comparative Example 2, a light emitting device was produced in the same manner as in Example 1 except that a resin composition containing the first fluorescent material prepared herein alone was used but not using the second fluorescent material. Table 2 shows the total amount (part by mass) of the first fluorescent material and the second fluorescent material, the blending ratio (part by mass) of the first fluorescent material and the blending ratio (part by mass) of the second fluorescent material, relative to 100 parts by mass of the resin in each resin composition of Examples 6 to 10 and Comparative Example 2. Table 2 also shows the ratio by mass (% by mass) of the first fluorescent material and the ratio by mass (% by mass) of the second fluorescent material relative to 100% by mass of the total amount of the first fluorescent material and the second fluorescent material in the light emitting device of Examples 6 to 10 and Comparative Example 2.

Examples 11 to 15 and Comparative Example 3

In Examples 11 to 15 and Comparative Example 3, (Sr,Ca)AlSiN$_3$:Eu (hereinafter this may be referred to as "640SCASN") having a light emission peak wavelength at 640 nm as excited by the light from a light emitting element having a light emission peak wavelength at 450 nm was used as the first fluorescent material. In Examples 11 to 15, a light emitting device was produced in the same manner as in Example 1, except that the first fluorescent material prepared herein and the same second fluorescent material as in Example 1 were used in the blending ratio (part by mass) shown in Table 3. In Comparative Example 3, a light emitting device was produced in the same manner as in Example 1 except that a resin composition containing the first fluorescent material prepared herein alone was used but not using the second fluorescent material. Table 3 shows the total amount (part by mass) of the first fluorescent material and the second fluorescent material, the blending ratio (part by mass) of the first fluorescent material and the blending ratio (part by mass) of the second fluorescent material, relative to 100 parts by mass of the resin in each resin composition of Examples 11 to 15 and Comparative Example 3. Table 3 also shows the ratio by mass (% by mass) of the first fluorescent material and the ratio by mass (% by mass) of the second fluorescent material relative to 100% by mass of the total amount of the first fluorescent material and the second fluorescent material in the light emitting device of Examples 11 to 15 and Comparative Example 3.

Examples 16 to 20

In Examples 16 to 20, (Sr,Ca)AlSiN$_3$:Eu having a light emission peak wavelength at 640 nm as excited by the light from a light emitting element having a light emission peak wavelength at 450 nm was used as the first fluorescent material, and (Al$_{0.9943}$Cr$_{0.0057}$)$_2$O$_3$ having a light emission peak wavelength at 692 nm as excited by the light from a light emitting element having a light emission peak wavelength at 450 nm was used as the second fluorescent material. In Examples 16 to 20, a light emitting device was produced in the same manner as in Example 1, except that the first fluorescent material and the second fluorescent material as prepared herein were used in the blending ratio (part by mass) shown in Table 4. Table 4 shows the total amount (part by mass) of the first fluorescent material and the second fluorescent material, the blending ratio (part by mass) of the first fluorescent material and the blending ratio (part by mass) of the second fluorescent material, relative to 100 parts by mass of the resin in each resin composition of Examples 16 to 20. Table 4 also shows the ratio by mass (% by mass) of the first fluorescent material and the ratio by mass (% by mass) of the second fluorescent material relative to 100% by mass of the total amount of the first fluorescent material and the second fluorescent material in the light emitting device of Examples 16 to 20. In Table 4, the blending ratio (part by mass) of each fluorescent material relative to 100 parts by mass of the resin in the resin composition of Comparative Example 3, and the ratio by mass (% by mass) of each fluorescent material in the light emitting device of Comparative Example 3 are also shown.

Examples 21 to 23

First Fluorescent Material
As the first fluorescent material, used here was (Sr, Ca)AlSiN$_3$:Eu having a light emission peak wavelength at 640 nm as excited by the light from a light emitting element having a light emission peak wavelength at 450 nm.
Second Fluorescent Material
As the second fluorescent material, a fluorescent material obtained according to the following production method was used.
As raw materials, Lu$_2$O$_3$, CeO$_2$, Cr$_2$O$_3$, and Al$_2$O$_3$ were used. These were weighed at a desired charge-in composition ratio. As a flux, BaF$_2$ was added thereto in an amount of 5 parts by mass relative to 100 parts by mass of the total amount of the raw materials not containing a flux, and dry-mixed in a ball mill for 1 hour to prepare a raw material mixture. The resultant raw material mixture was charged in an alumina crucible, covered with a lid, and heat-treated in a reductive atmosphere of 3 vol % H$_2$ and 97 vol % N$_2$ at 1500° C. for 10 hours to give a baked product. The calcined product was led to pass through a dry sieve to give a second fluorescent material. The resultant second fluorescent material was analyzed through ICP-AES spectrometry using an inductively coupled plasma spectrometer (by Perkin Elmer) for composition analysis. The composition of the resultant second fluorescent material was (Lu$_{0.9725}$Ce$_{0.0175}$Cr$_{0.01}$)$_3$Al$_5$O$_{12}$ (hereinafter this may be referred to as "LAG:Ce, Cr"). The second fluorescent material has a light emission peak wavelength at 687 nm, as excited by the light from a light emitting element having a light emission peak wavelength at 450 nm.
Light Emitting Device
In Examples 21 to 23, (Sr,Ca)AlSiN$_3$:Eu having a light emission peak wavelength at 640 nm as excited by the light from a light emitting element having a light emission peak wavelength at 450 nm was used as the first fluorescent material, and LAG: Ce, Cr having a light emission peak wavelength at 687 nm as excited by the light from a light emitting element having a light emission peak wavelength at 450 nm was used as the second fluorescent material. In Examples 21 to 23, a light emitting device was produced in the same manner as in Example 1, except that the first fluorescent material and the second fluorescent material as prepared herein were used in the blending ratio (part by mass) shown in Table 5. Table 5 shows the total amount (part by mass) of the first fluorescent material and the second fluorescent material, the blending ratio (part by mass) of the first fluorescent material and the blending ratio (part by mass) of the second fluorescent material, relative to 100 parts by mass of the resin in each resin composition of Examples 21 to 23. Table 5 also shows the ratio by mass (% by mass) of the first fluorescent material and the ratio by mass (% by mass) of the second fluorescent material relative to 100% by mass of the total amount of the first fluorescent material 71 and the second fluorescent material 72 in the light emitting device of Examples 21 to 23. In Table 5, the blending ratio (part by mass) of each fluorescent material relative to 100 parts by mass of the resin in the resin composition of Comparative Example 3, and the ratio by mass (% by mass) of each fluorescent material in the light emitting device of Comparative Example 3 are also shown.

Examples 24 to 26

First Fluorescent Material

As the first fluorescent material, used here was (Sr, Ca)AlSiN$_3$:Eu having a light emission peak wavelength at 640 nm as excited by the light from a light emitting element having a light emission peak wavelength at 450 nm.

Second Fluorescent Material

As the second fluorescent material, a fluorescent material obtained according to the following production method was used.

As raw materials, Gd$_2$O$_3$, CeO$_2$, Cr$_2$O$_3$, and Al$_2$O$_3$ were used. These were weighed at a desired charge-in composition ratio. As a flux, BaF$_2$ was added thereto in an amount of 5 parts by mass relative to 100 parts by mass of the total amount of the raw materials not containing a flux, and dry-mixed in a ball mill for 1 hour to prepare a raw material mixture. The resultant raw material mixture was charged in an alumina crucible, covered with a lid, and heat-treated in a reductive atmosphere of 3 vol % H$_2$ and 97 vol % N$_2$ at 1500° C. for 10 hours to give a baked product. The calcined product was led to pass through a dry sieve to give a second fluorescent material. The resultant second fluorescent material was analyzed through ICP-AES spectrometry using an inductively coupled plasma spectrometer (by Perkin Elmer) for composition analysis. The composition of the resultant second fluorescent material was (Gd$_{0.9675}$Ce$_{0.0125}$Cr$_{0.02}$)$_3$Al$_5$O$_{12}$ (hereinafter this may be referred to as "GAG:Ce, Cr"). The second fluorescent material has a light emission peak wavelength at 727 nm, as excited by the light from a light emitting element having a light emission peak wavelength at 450 nm.

Light Emitting Device

In Examples 24 to 26, (Sr,Ca)AlSiN$_3$:Eu having a light emission peak wavelength at 640 nm as excited by the light from a light emitting element having a light emission peak wavelength at 450 nm was used as the first fluorescent material, and GAG:Ce, Cr having a light emission peak wavelength at 727 nm as excited by the light from a light emitting element having a light emission peak wavelength at 450 nm was used as the second fluorescent material. In Examples 24 to 26, a light emitting device was produced in the same manner as in Example 1, except that the first fluorescent material and the second fluorescent material as prepared herein were used in the blending ratio (part by mass) shown in Table 6. Table 6 shows the total amount (part by mass) of the first fluorescent material and the second fluorescent material, the blending ratio (part by mass) of the first fluorescent material and the blending ratio (part by mass) of the second fluorescent material, relative to 100 parts by mass of the resin in each resin composition of Examples 24 to 26. Table 6 also shows the ratio by mass (% by mass) of the first fluorescent material and the ratio by mass (% by mass) of the second fluorescent material relative to 100% by mass of the total amount of the first fluorescent material and the second fluorescent material in the light emitting device. In Table 6, the blending ratio (part by mass) of each fluorescent material relative to 100 parts by mass of the resin in the resin composition of Comparative Example 3, and the ratio by mass (% by mass) of each fluorescent material in the light emitting device of Comparative Example 3 are also shown.

Relative Photon Flux

Figure 2:
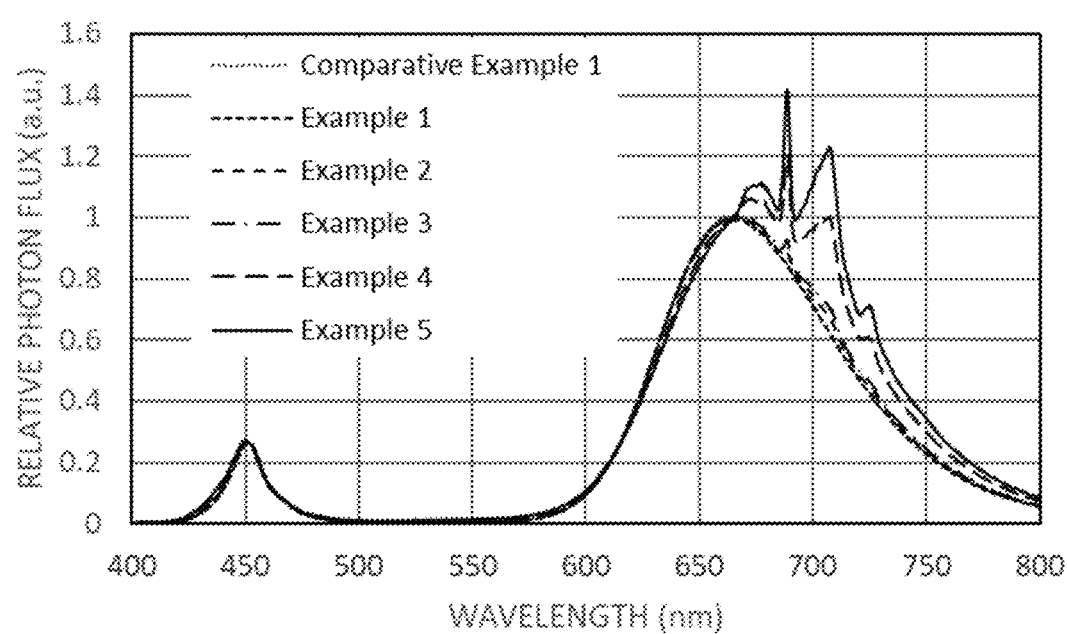
FIG. 2 shows spectra of relative photon flux vs. wavelength of light emitted from the light emitting devices of Examples 1 to 5 and Comparative Example 1.
Figure 3:
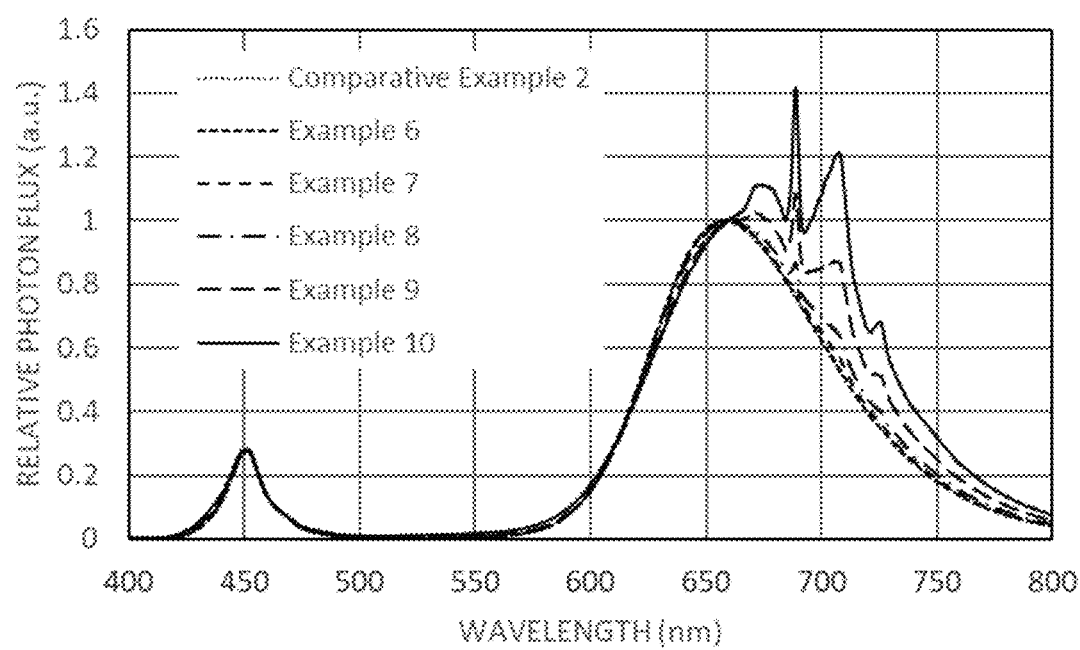
FIG. 3 shows spectra of relative photon flux vs. wavelength of light emitted from the light emitting devices of Examples 6 to 10 and Comparative Example 2.
Figure 4:
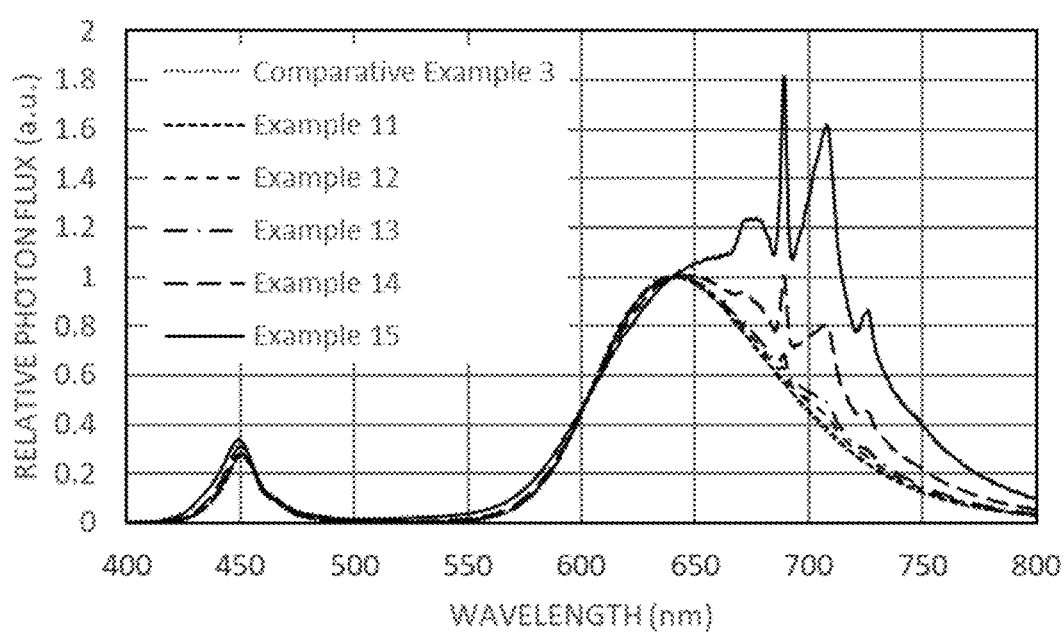
FIG. 4 shows spectra of relative photon flux vs. wavelength of light emitted from the light emitting devices of Examples 11 to 15 and Comparative Example 3.
Figure 5:
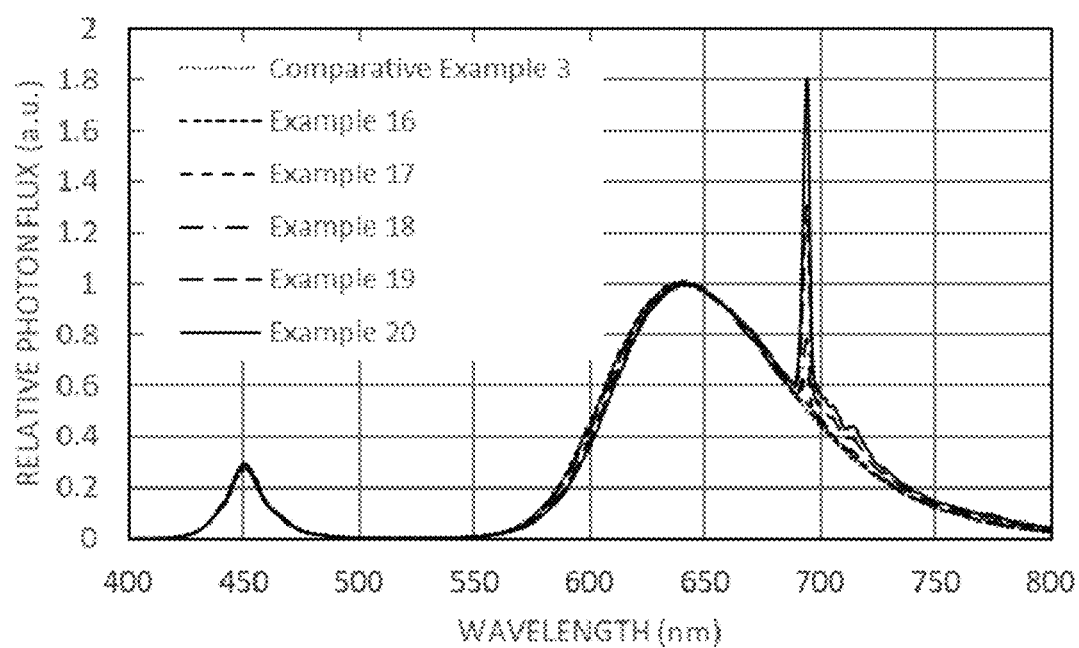
FIG. 5 shows spectra of relative photon flux vs. wavelength of light emitted from the light emitting devices of Examples 16 to 20 and Comparative Example 3.
Figure 6:
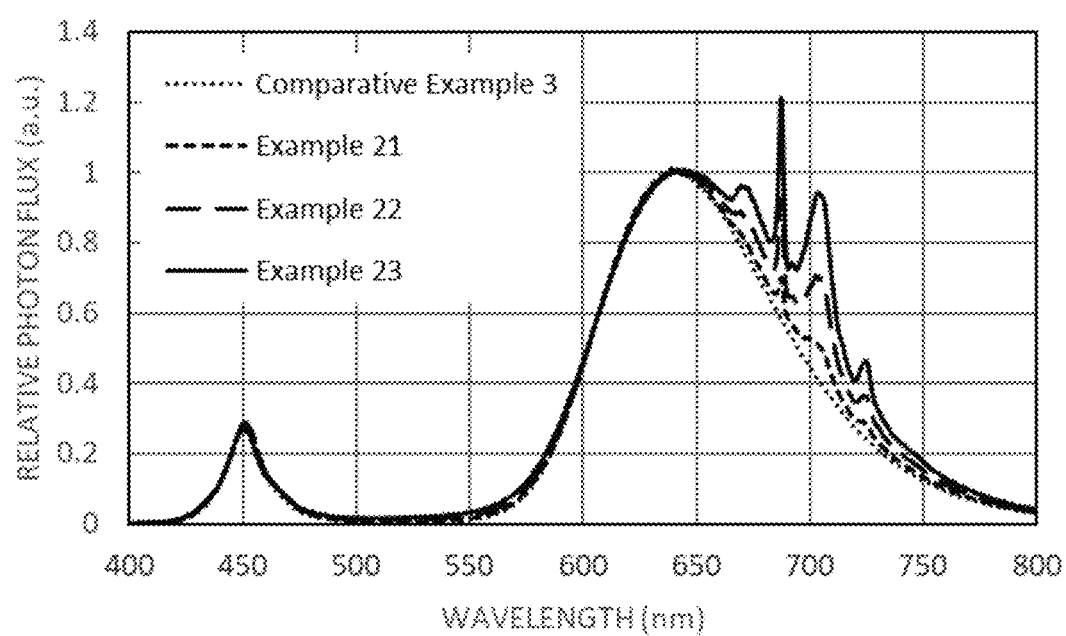
FIG. 6 shows spectra of relative photon flux vs. wavelength of light emitted from the light emitting devices of Examples 21 to 23 and Comparative Example 3.
Figure 7:
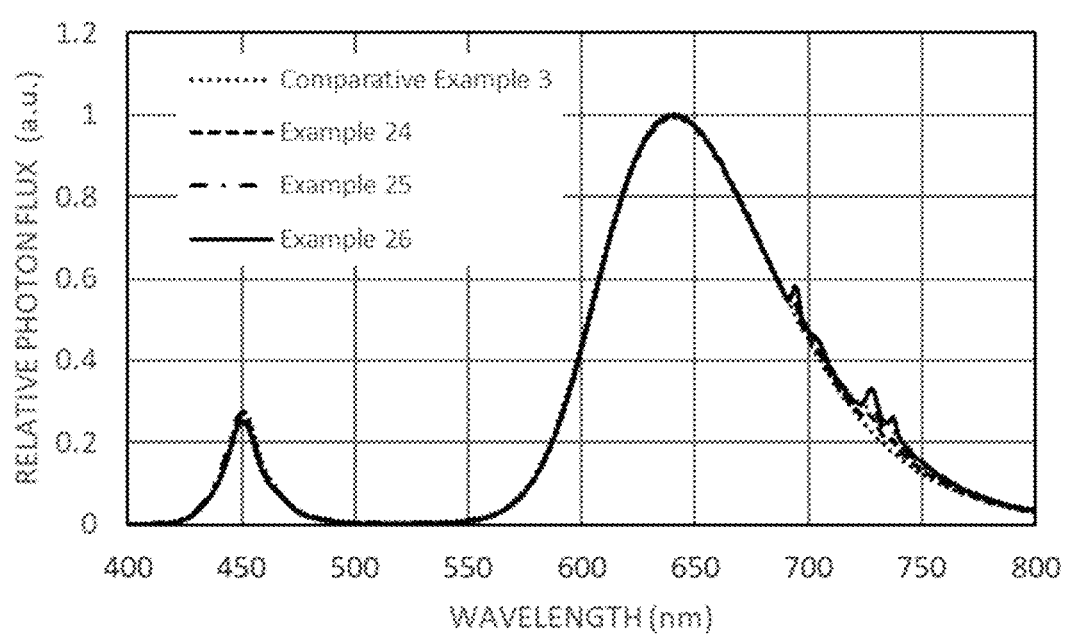
FIG. 7 shows spectra of relative photon flux vs. wavelength of light emitted from the light emitting devices of Examples 24 to 26 and Comparative Example 3.

The light emitted from the light emitting device of each Example and each Comparative Example was measured using a spectrometer (PMA-11 available from Hamamatsu Photonics). The resultant radiation flux (W) was converted into a photon flux based on the following equation (1) to draw a photon flux spectrum. FIG. 2 shows spectra of relative photon flux vs. wavelength of the light emitting devices of Examples 1 to 5 and Comparative Example 1, relative to 1 the photon flux at a wavelength of 670 nm in each light emitting device. FIG. 3 shows spectra of relative photon flux vs. wavelength of the light emitting devices of Examples 6 to 10 and Comparative Example 2, relative to the photon flux at a wavelength of 660 nm in each light emitting device. FIG. 4 shows spectra of relative photon flux vs. wavelength of the light emitting devices of Examples 11 to 15 and Comparative Example 3, relative to the photon flux at a wavelength of 640 nm in each light emitting device. FIG. 5 shows spectra of relative photon flux vs. wavelength of the light emitting devices of Examples 16 to 20 and Comparative Example 3, relative to the photon flux at a wavelength of 640 nm in each light emitting device. FIG. 6 shows spectra of relative photon flux vs. wavelength of the light emitting devices of Examples 21 to 23 and Comparative Example 3, relative to the photon flux at a wavelength of 640 nm in each light emitting device. FIG. 7 shows spectra of relative photon flux vs. wavelength of the light emitting devices of Examples 24 to 26 and Comparative Example 3, relative to the photon flux at a wavelength of 640 nm in each light emitting device.

Radiation Flux ($W$)=photon flux (mol·s$^{-1}$)×Avogadro number (mol$^{-1}$)×Planck constant ($Js$)×light speed (m·s$^{-1}$)÷wavelength ($m$) (1)

Photon Flux

In Examples and Comparative Examples, the photon flux in each wavelength range was calculated using the photon flux spectrum of the light emitting device obtained from the equation (1). The photon flux in a wavelength range of 400 nm or more and 490 nm or less was integrated to calculate the photon flux B of blue light. In addition, the photon flux in a wavelength range of 620 nm or more and less than 700 nm was integrated to calculate the photon flux R of red light. The photo flux in a wavelength range of 700 nm or more and 780 nm or less was integrated to calculate the photon flux Fr of far-red light. From the data of the photon flux B, R and Fr of the light emitting devices of Examples and Comparative Examples, the ratio R/B of the photon flux R to the photon flux B, and the ratio R/Fr of the photon flux R to the photon flux Fr, were calculated. The results are shown in Table 1 to Table 6.

Figure 8:
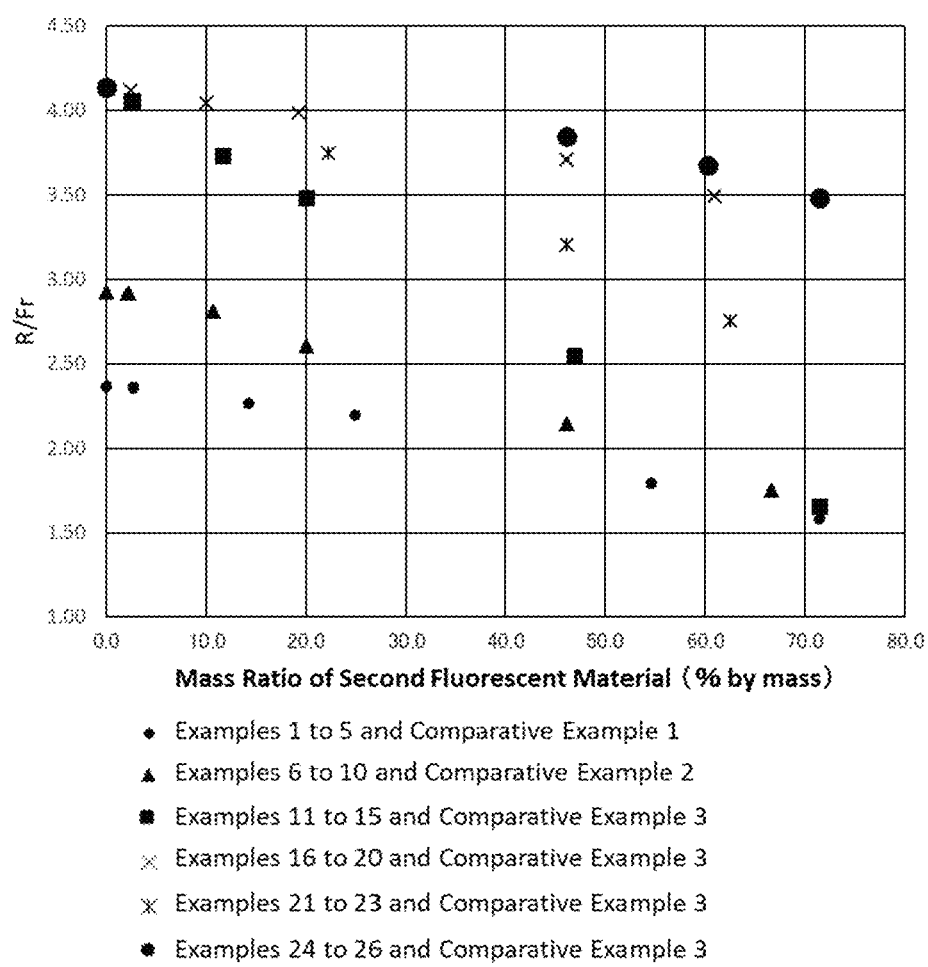
FIG. 8 is a graph showing a relationship between the mass content of a second fluorescent material and the ratio (R/Fr) of a photon flux R of red light to a photon flux of Fr of far-red light in the light emitting devices of Examples 1 to 26 and Comparative Examples 1 to 3.

FIG. 8 is a graph showing the relationship between the mass content of the second fluorescent material in the fluorescent member in each light emitting device of Examples 1 to 5 and Comparative Example 1, Examples 6 to 10 and Comparative Example 2, Examples 11 to 15 and Comparative Example 3, Examples 16 to 20 and Comparative Example 3, Examples 21 to 23 and Comparative Example 3, and Examples 24 to 26 and Comparative Example 3, and the ratio of the photon flux R to the photon flux Fr, R/Fr of each of those light emitting devices.

TABLE 1

| | Fluorescent Material | | | | | | |
|---|---|---|---|---|---|---|---|
| | Fluorescent Member | | | | | | |
| | Total of First Fluorescent Material and Second Fluorescent Material (part by mass*) | First Fluorescent Material 670CASN (part by mass*) | Second Fluorescent Material YAG:CeCr (part by mass*) | ratio by mass | | Photon Flux Ratio | |
| | | | | First Fluorescent Material 670CASN (%) | Second Fluorescent Material YAG:CeCr (%) | R/B | R/Fr |
| Comparative Example 1 | 40 | 40 | 0 | 100.0 | 0.0 | 11.12 | 2.37 |
| Example 1 | 38 | 37 | 1 | 97.4 | 2.6 | 11.05 | 2.36 |
| Example 2 | 35 | 30 | 5 | 85.7 | 14.3 | 10.96 | 2.27 |
| Example 3 | 40 | 30 | 10 | 75.0 | 25.0 | 10.73 | 2.20 |
| Example 4 | 55 | 25 | 30 | 45.5 | 54.5 | 10.49 | 1.80 |
| Example 5 | 70 | 20 | 50 | 28.6 | 71.4 | 10.56 | 1.59 |

*part by mass of the fluorescent material relative to 100 parts by mass of the resin in the fluorescent member

TABLE 2

| | Fluorescent Material | | | | | | |
|---|---|---|---|---|---|---|---|
| | Fluorescent Member | | | | | | |
| | Total of First Fluorescent Material and Second Fluorescent Material (part by mass*) | First Fluorescent Material 660CASN (part by mass*) | Second Fluorescent Material YAG:CeCr (part by mass*) | ratio by mass | | Photon Flux Ratio | |
| | | | | First Fluorescent Material 660CASN (%) | Second Fluorescent Material YAG:CeCr (%) | R/B | R/Fr |
| Comparative Example 2 | 45 | 45 | 0 | 100.0 | 0.0 | 10.94 | 2.93 |
| Example 6 | 46 | 45 | 1 | 97.8 | 2.2 | 10.52 | 2.92 |
| Example 7 | 47 | 42 | 5 | 89.4 | 10.6 | 10.44 | 2.81 |
| Example 8 | 50 | 40 | 10 | 80.0 | 20.0 | 10.84 | 2.61 |
| Example 9 | 65 | 35 | 30 | 53.8 | 46.2 | 10.57 | 2.15 |
| Example 10 | 75 | 25 | 50 | 33.3 | 66.7 | 10.78 | 1.75 |

*part by mass of the fluorescent material relative to 100 parts by mass of the resin in the fluorescent member

TABLE 3

| | Fluorescent Material | | | | | | |
|---|---|---|---|---|---|---|---|
| | Fluorescent Member | | | | | | |
| | Total of First Fluorescent Material and Second Fluorescent Material (part by mass*) | First Fluorescent Material 640SCASN (part by mass*) | Second Fluorescent Material YAG:CeCr (part by mass*) | ratio by mass | | Photon Flux Ratio | |
| | | | | First Fluorescent Material 640SCASN (%) | Second Fluorescent Material YAG:CeCr (%) | R/B | R/Fr |
| Comparative Example 3 | 42 | 42 | 0 | 100.0 | 0.0 | 10.52 | 4.14 |
| Example 11 | 40 | 39 | 1 | 97.5 | 2.5 | 10.35 | 4.06 |
| Example 12 | 43 | 38 | 5 | 88.4 | 11.6 | 10.58 | 3.74 |
| Example 13 | 50 | 40 | 10 | 80.0 | 20.0 | 10.65 | 3.49 |
| Example 14 | 64 | 34 | 30 | 53.1 | 46.9 | 10.16 | 2.55 |
| Example 15 | 70 | 20 | 50 | 28.6 | 71.4 | 10.40 | 1.66 |

*part by mass of the fluorescent material relative to 100 parts by mass of the resin in the fluorescent member

TABLE 4

| | Fluorescent Material | | | | | | |
|---|---|---|---|---|---|---|---|
| | Fluorescent Member | | | ratio by mass | | | |
| | Total of First Fluorescent Material and Second Fluorescent Material | First Fluorescent Material 640SCASN | Second Fluorescent Material $Al_2O_3$:Cr | First Fluorescent Material 640SCASN | Second Fluorescent Material $Al_2O_3$:Cr | Photon Flux Ratio | |
| | (part by mass*) | (part by mass*) | (part by mass*) | (%) | (%) | R/B | R/Fr |
| Comparative Example 3 | 42 | 42 | 0 | 100.0 | 0.0 | 10.52 | 4.14 |
| Example 16 | 43 | 42 | 1 | 97.7 | 2.3 | 10.41 | 4.12 |
| Example 17 | 50 | 45 | 5 | 90.0 | 10.0 | 10.70 | 4.05 |
| Example 18 | 52 | 42 | 10 | 80.8 | 19.2 | 10.38 | 3.99 |
| Example 19 | 65 | 35 | 30 | 53.8 | 46.2 | 10.46 | 3.71 |
| Example 20 | 82 | 32 | 50 | 39.0 | 61.0 | 10.73 | 3.50 |

*part by mass of the fluorescent material relative to 100 parts by mass of the resin in the fluorescent member

TABLE 5

| | Fluorescent Material | | | | | | |
|---|---|---|---|---|---|---|---|
| | Fluorescent Member | | | ratio by mass | | | |
| | Total of First Fluorescent Material and Second Fluorescent Material | First Fluorescent Material 640SCASN | Second Fluorescent Material LAG:CeCr | First Fluorescent Material 640SCASN | Second Fluorescent Material LAG:CeCr | Photon Flux Ratio | |
| | (part by mass*) | (part by mass*) | (part by mass*) | (%) | (%) | R/B | R/Fr |
| Comparative Example 3 | 42 | 42 | 0 | 100.0 | 0.0 | 10.52 | 4.14 |
| Example 21 | 45 | 35 | 10 | 77.8 | 22.2 | 10.20 | 3.75 |
| Example 22 | 65 | 35 | 30 | 53.8 | 46.2 | 10.36 | 3.21 |
| Example 23 | 80 | 30 | 50 | 37.5 | 62.5 | 11.25 | 2.75 |

*part by mass of the fluorescent material relative to 100 parts by mass of the resin in the fluorescent member

TABLE 6

| | Fluorescent Material | | | | | | |
|---|---|---|---|---|---|---|---|
| | Fluorescent Member | | | ratio by mass | | | |
| | Total of First Fluorescent Material and Second Fluorescent Material | First Fluorescent Material 640SCASN | Second Fluorescent Material GAG:CeCr | First Fluorescent Material 640SCASN | Second Fluorescent Material GAG:CeCr | Photon Flux Ratio | |
| | (part by mass*) | (part by mass*) | (part by mass*) | (%) | (%) | R/B | R/Fr |
| Comparative Example 3 | 42 | 42 | 0 | 100.0 | 0.0 | 10.52 | 4.14 |
| Example 24 | 65 | 35 | 30 | 53.8 | 46.2 | 10.97 | 3.85 |
| Example 25 | 83 | 33 | 50 | 39.8 | 60.2 | 10.64 | 3.68 |
| Example 26 | 105 | 30 | 75 | 28.6 | 71.4 | 11.41 | 3.48 |

*part by mass of the fluorescent material relative to 100 parts by mass of the resin in the fluorescent member As shown in Tables 1 to 6, the light emitting devices of Examples 1 to 26 are such that the ratio R/B of the photon flux R of red light to the photon flux B of blue light is more than 10 and 12 or less and the ratio R/Fr of the photon flux R of red light to the photon flux Fr of far-red light is 1.59 or more and 4.12 or less.

As shown in FIG. 2 to FIG. 7, the light emitting devices provided with a first fluorescent material and a second fluorescent material are confirmed to be such that the light emitting element has a light emission peak wavelength at 450 nm, the first fluorescent material has, as excited by the light from the light emitting element, at least one light emission peak wavelength in a wavelength range of 580 nm or more and less than 680 nm, and the second fluorescent material has, as excited by the light from the light emitting element, at least one light emission peak wavelength in a wavelength range of 680 nm or more and 800 nm or less.

As shown in Tables 1 to 6, the light emitting devices of Comparative Examples 1 to 3 are such that the ratio R/B of the photo flux R to the photon flux B is 10 or more. However, the light emitting devices of Comparative Examples 1 to 3 are not provided with a fluorescent member containing a second fluorescent material, and therefore the ratio R/Fr in the light emitting device of Comparative Example 1 is larger than the ratio R/Fr in each light emitting device of Examples 1 to 5; the ratio R/Fr in the light emitting device of Comparative Example 2 is larger than the ratio R/Fr in each light emitting device of Examples 6 to 10; and the ratio R/Fr in the light emitting device of Comparative Example 3 is larger than the ratio R/Fr in each light emitting device of Examples 11 to 26. Consequently, these comparative light emitting devices could hardly be controlled so as to emit a mixed light having a small ratio R/Fr that can be readily absorbed by plant photoreceptors and that can promote plant photomorphogenesis.

As shown in FIGS. 2 to 7, the light emitting devices of Comparative Examples 1 to 3 not provided with a fluorescent member containing a second fluorescent material did not have at least one light emission peak wavelength in a wavelength range of 680 nm or more and 800 nm or less even when excited by the light from the light emitting element having a light emission peak wavelength at 450 nm.

Figure 11:
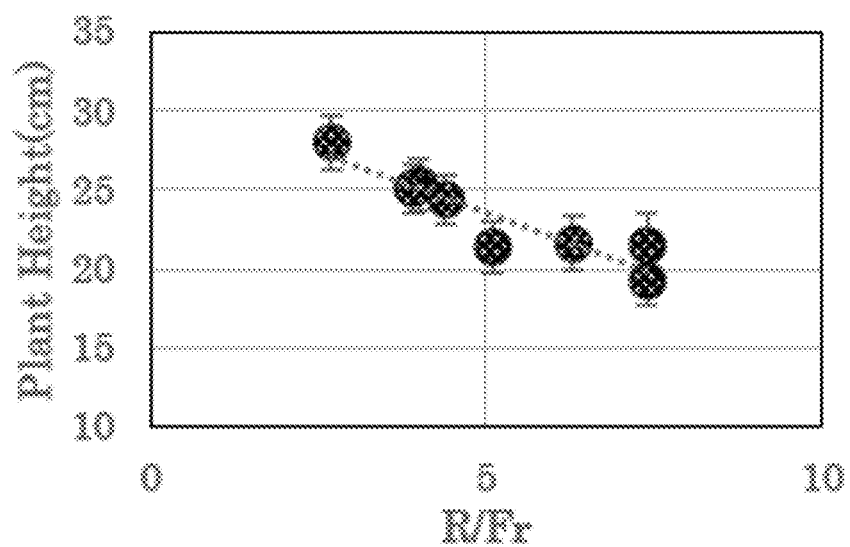
FIG. 11 is a graph showing a relationship between the plant height (cm) of romaine lettuce and the ratio R/Fr described in NPL 1.

As shown in FIG. 8, it is confirmed that, in the light emitting devices of Examples 1 to 26, the ratio R/Fr of the photon flux R of red light to the photon flux Fr of far-red light can be controlled by the amount of the second fluorescent material contained in the fluorescent member. As in FIG. 11 described in NPL 1, the difference in spectral distribution between light sources may have an influence on the height of romaine lettuce, and when the ratio R/Fr is small, the height of romaine lettuce is low. Like in the light emitting devices of Examples 1 to 26 shown in FIG. 8, when a mixed light whose ratio R/B of the photon flux R of red light to the photon flux B of blue light and whose ratio R/Fr of the photon flux R to the photon flux Fr are controlled is radiated to plants, the plant photoreceptors to carry out photomorphogenesis, for example, two photoreceptors of red light-absorbing (Pr-type) phytochrome and far-red light-absorbing (Pfr-type) phytochrome can absorb the radiated light to promote plant photomorphogenesis and thereby to promote plant cultivation.

Next, the light emitting device of Examples or Comparative Examples was combined with a white LED, a light source to emit white light, to produce a light emitting device to be a light source for plant cultivation. Hereinafter the light emitting device constructed by combining the light emitting device of Examples or Comparative Examples and a white LED is referred to as a light source for plant cultivation.

Light Source A for Plant Cultivation

The light emitting device of Comparative Example 2 was combined with a white LED to produce a light source A for plant cultivation.

Light Source B for Plant Cultivation

The light emitting device of Example 8 was combined with a white LED to produce a light source B for plant cultivation.

Light Source C for Plant Cultivation

The light emitting device of Example 9 was combined with a white LED to produce a light source C for plant cultivation.

Light Source D for Plant Cultivation

The light emitting device of Example 10 was combined with a white LED to produce a light source D for plant cultivation.

Figure 9:
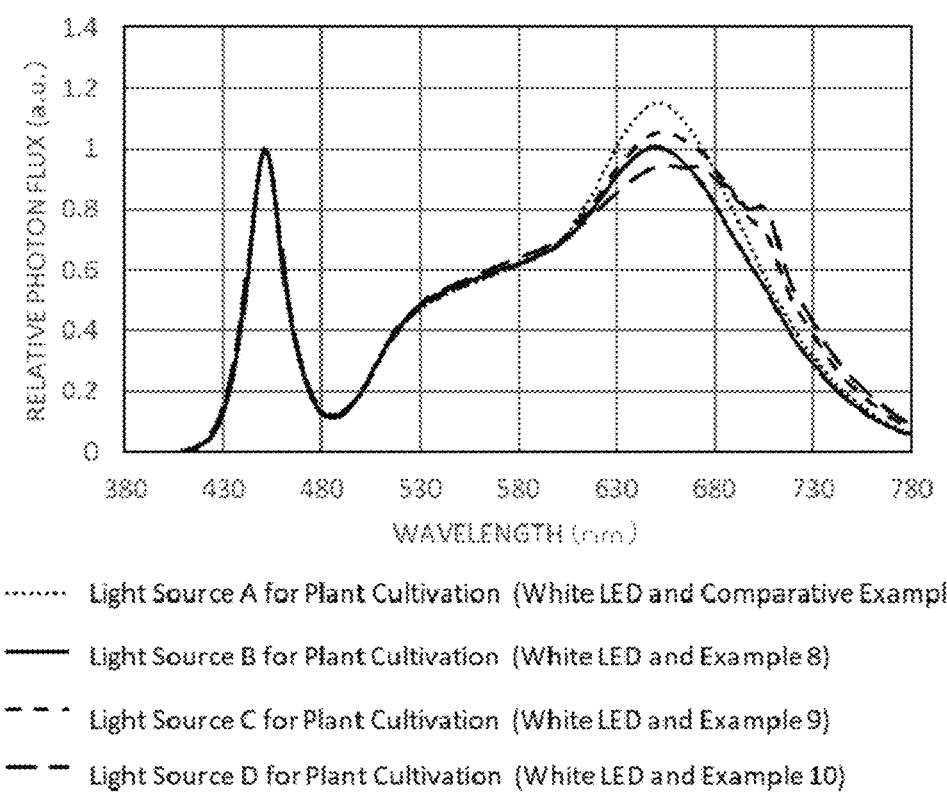
FIG. 9 shows spectra of relative photon flux vs. wavelength of a light source for plant cultivation using a combination of a white light emitting light source and one of the light emitting devices of Examples 8-10 and Comparative Example 2.

The photon flux spectrum of the light emitted from the light sources A to D for plant cultivation was measured, using a spectral irradiance meter (CL-500A available from Konica Minolta), and the photon flux B of blue light was calculated by integrating the photon flux in a wavelength range of 400 nm or more and 490 nm or less, the photon flux R of red light was calculated by integrating the photon flux in a wavelength range of 620 nm or more and less than 700 nm, and the photon flux Fr of far-red light was calculated by integrating the photon flux in a wavelength range of 700 nm or more and 780 nm or less. From these, the ratio R/B of the photon flux R of red light to the photon flux B of blue light, and the ratio R/Fr of the photon flux R of red light to the photon flux Fr of far-red light, were calculated. The results are shown in Table 7. FIG. 9 shows spectra of relative photon flux vs. wavelength, relative to the photo flux at the light emission peak wavelength falling within a wavelength range of 380 nm or more and 490 nm or less of the light sources A to D for plant cultivation.

Plant Cultivation Test

Korean lettuce was cultivated in this test.

Seeding

Seeds were sowed on urethane sponge (popular flat article, available from Tokuyama Corporation), and irradiated with light from a white LED (available from Nichia Corporation) for germination and raising seedlings.

Under the conditions of a room temperature 25° C., a humidity of 60%, a CO2 concentration of 800 to 1100 ppm, a photon flux density of white LED of 80 $\mu mol \cdot m^{-2} \cdot s^{-1}$, and a day length of 16 hr/day, the plants were cultivated for 7 days.

Settled Planting

In 7 days after the seeding, the size of the third leaf of the Korean lettuce was measured, and the plants having a nearly equal size were tried in the test. The reason why the Korean lettuce plants in which the size of the third leaf is nearly equal are tried in the test is for the purpose of suppressing as much as possible the seed-caused fluctuation to thereby clarify the difference in plant cultivation owing to the influence of the light from the light source as the intended purpose.

The plants selected for the test were irradiated with the light of the light sources A to D for plant cultivation, and the plants were cultivated in a mode of hydroponic culture. Under the conditions of a room temperature 25° C., a humidity of 60%, a $CO_2$ concentration of 800 to 1100 ppm, a photon flux density of the light sources A to D for cultivation of 310 $\mu mol \cdot m^{-2} \cdot s^{-1}$, and a day length of 16 hr/day, the plants were cultivated for 25 days. For the nourishing solution used here, NS No. 1 (available from OAT Agrio) and NS No. 2 (available from OAT Agrio) were mixed in a ratio of 2/3 by mass (NS No. 1:NS No. 2) and dissolved in water. The conductivity of the nourishing solution was 2.0 $mS \cdot cm^{-1}$. The ratio R/B of the photon flux R of red light to the photon flux B of blue light of the light from the light sources A to D for cultivation and the ratio R/Fr of the photon flux R of red light to the photon flux Fr of far-red light thereof did not change through the settled planting period.

Measurement of Fresh Weight (Edible Part)

After the cultivation, the plants were harvested, the roots were removed from the harvested plants, and the wet weight of the areal part of each plant was measured. The light from each of the light sources A to D for plant cultivation was radiated to 6 plants in hydroponic culture, and the wet weight of the areal part of each hydroponic-cultivated plant was measured as a fresh weight (edible part) (g). A mean value (g) of the fresh weight (edible part) of the 6 plants is shown in Table 7.

Measurement of Plant Height

The light from each of the light sources A to D for plant cultivation was radiated to 6 plants in hydroponic culture, and the hydroponic-cultivated plants were harvested. The length from the plant root to the longest leaf tip of each harvested plant was measured as a plant height (cm). A mean value of the plant height (cm) of the 6 plants is shown in Table 7.

TABLE 7

| | | Ratio of Photon Flux | | Mean Value | |
|---|---|---|---|---|---|
| | | | | Fresh Weight | Plant Height |
| | Light Source for Plant Cultivation | R/B | R/Fr | (g) | (cm) |
| A | White LED 1 + Comparative Example 2 | 3.0 | 3.6 | 103 | 18 |
| B | White LED 1 + Example 8 | 2.6 | 3.4 | 108 | 18 |
| C | White LED 1 + Example 9 | 2.8 | 2.8 | 114 | 18 |
| D | White LED 1 + Example 10 | 2.5 | 2.3 | 113 | 19 |

As shown in Table 7, the fresh weight (edible part) increased in the plants irradiated with the light sources B to D for plant cultivation, a combination of the light emitting device of Example 8, 9 or 10 and a white LED, as compared with that in the plants irradiated with the light source A for plant cultivation, a combination of the light emitting device of Comparative Example 2 and a white LED, and the plant height of the former also increased. From these results, it is confirmed that the light emitting device of the first embodiment of the present disclosure is, when combined with a light source that emits white light, able to emit light that can be readily absorbed by plant photoreceptors to carry out plant photosynthesis and by plant photoreceptors to carry out photomorphogenesis such as stem elongation and development of cotyledon, and therefore can promote plant growth.

As shown in Table 7, in the light sources B to D for plant cultivation using the light emitting device of Example 8, 9 or 10 as combined with a white LED, the ratio R/Fr of the photon flux R of red light to the photon flux Fr of far-red light is smaller than that in the light source A for plant cultivation using the light emitting device of Comparative Example 2 and a white LED. It is presumed that, since the Fr component increased therein, the light sources B to D can activate photosynthesis owing to the synergistic effect (Emmerson effect) of the two kinds of light, far-red light and red light, and can therefore promote plant growth.

Next, as a reference example, the relationship of temperature vs. peak wavelength between CaAlSiN$_3$:Eu (660CASN) having an emission peak wavelength at 660 nm, as excited by the light from the light emitting element having a light emission peak wavelength at 450 nm used as the first fluorescent material in Comparative Example 2 and Examples 8 to 10, and a red LED having a light emission peak wavelength at around 660 nm was measured. Specifically, at 25° C., 105° C. or 140° C., the light from the light emitting element having a light emission peak wavelength at 450 nm was radiated to 660CASN fluorescent material, and the spectrum of the light emitted from the 660CASN fluorescent material was measured using a spectrometer, and the peak wavelength of the light emission spectrum at each temperature was determined. At 25° C., 85° C. or 120° C., the spectrum of the light from the red LED was measured with a spectrometer, and the peak wavelength of the spectrum at each temperature was determined. The results are shown in Table 8 and FIG. 10.

TABLE 8

| | Temperature (° C.) | Peak Wavelength (nm) |
|---|---|---|
| 660CASN | 25 | 657.33 |
| | 105 | 656.08 |
| | 140 | 655.84 |
| Red LED | 25 | 657.89 |
| | 85 | 667.04 |
| | 120 | 672.60 |

Figure 10:
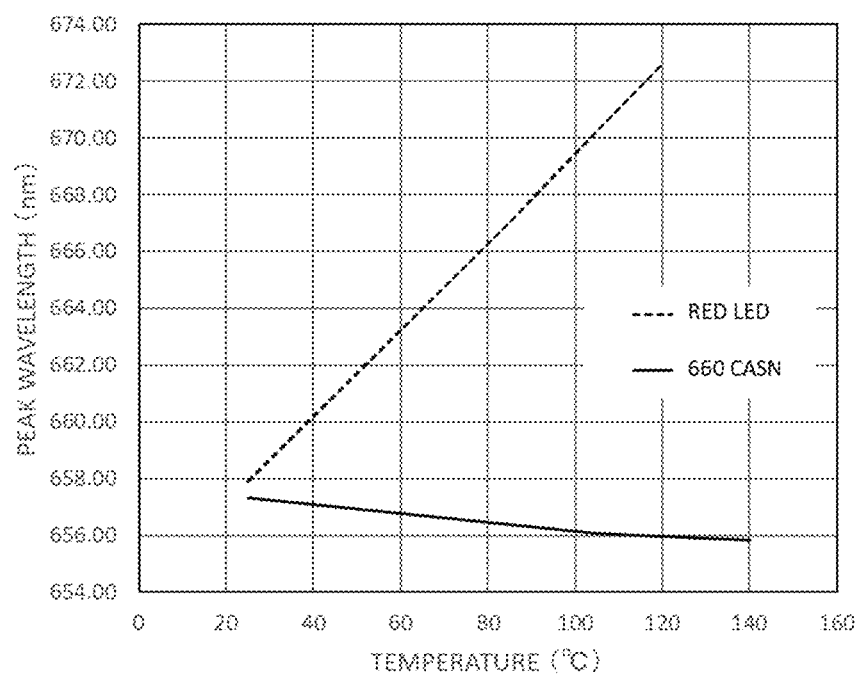
FIG. 10 is a graph showing a relationship between the peak wavelength and the temperature of a first fluorescent material $CaAlSiN_3$:Eu(660CASN) and a red LED having a light emission peak wavelength at around 660 nm.

As shown in Table 8 and FIG. 10, 660CASN used as the first fluorescent material in the light emitting devices of Examples 6 to 10 showed little peak wavelength fluctuation, even when used in a temperature range of room temperature 25° C. to a high temperature 140° C. On the other hand, the peak wavelength of the red LED greatly shifted toward the long wavelength side at a higher temperature in the case where it was used at 25° C. and at a high temperature 120° C. From these results, it is known that the peak wavelength of the red LED varies depending on the ambient temperature and therefore it is difficult to control the photon flux of red light from the red LED, that is, even when the ratio R/B of the photon flux R of red light to the photon flux B of blue right thereof, and the ratio R/Fr of the photon flux R of red light to the photon flux Fr of far-red light thereof could be controlled, the ratio R/B and the ratio R/Fr would still fluctuate depending on the ambient temperature so that the plant growth with the red LED would be unstable.

The light emitting device of one aspect of the present invention can emit light that can be readily absorbed by plant photoreceptors to carry out photomorphogenesis, and therefore can be utilized as a light emitting device or an illumination device for plant cultivation that promotes plant photomorphogenesis and promotes plant growth. The light emitting device of one aspect of the present invention is, when combined with a light source that emits white light or with a light source that emits a light energy different from the light energy from the light emitting device, able to be used as a light emitting device for light supplement for promoting plant growth.

The invention claimed is:
1. A light emitting device comprising:
a light emitting element having a light emission peak wavelength in a wavelength range of 380 nm or more and 490 nm or less; and
a first fluorescent material which is excited by the light from the light emitting element to emit light having at least one light emission peak in a wavelength range of 580 nm or more and less than 680 nm, and a second fluorescent material which is excited by the light from the light emitting element to emit light having at least one light emission peak in a wavelength range of 680 nm or more and 800 nm or less, wherein the second fluorescent material contains at least one fluorescent material selected from a first aluminate fluorescent material having a composition represented by the following formula (I) and a second aluminate fluorescent material having a composition represented by the following formula (II):

$$(Al_{1-w}Cr_w)_2O_3 \tag{I}$$

wherein w represents a number satisfying 0<w<1, $$(Ln_{1-x-y}Ce_xCr_y)_3(Al_{1-z}M_z)_5O_{12} \tag{II}$$

wherein Ln represents at least one rare earth element selected from the group consisting of rare earth elements except Ce, M represents at least one element selected from the group consisting of Ga and In, x, y and z each are a number satisfying 0.0002<x<0.50, 0.0001<y<0.05, and 0≤z≤0.8, and wherein the light emitting device emits light having a ratio R/B of a photon flux R to a photon flux B within a range of more than 10 and 38 or less, and a ratio R/Fr of the photon flux R to a photon flux Fr within a range of 0.1 or more and 10 or less, wherein the photon flux R is in a range of 620 nm or more and less than 700 nm, the photon flux B is in a range of 400 nm or more and 490 nm or less, and the photon flux Fr is in a range of 700 nm or more and 780 nm or less.

2. The light emitting device according to claim 1, wherein a ratio of the second fluorescent material to a total of the first fluorescent material and the second fluorescent material is 2% by mass or more and 80% by mass or less.

3. The light emitting device according to claim 1, wherein the first fluorescent material contains a nitride fluorescent material having a composition containing Eu, Al, Si and at least one element selected from Sr and Ca.

4. The light emitting device according to claim 3, wherein the first fluorescent material contains a nitride fluorescent material having a composition represented by the following formula (III):

$$(Ca_{1-p-q}Sr_pEu_q)AlSiN_3 \tag{III}$$

wherein p and q each satisfy 0≤p≤1.0, 0<q<0.5, 0<p+q≤1.0.

5. The light emitting device according to claim 1, comprising a fluorescent member containing the first fluorescent material, the second fluorescent material and a resin, wherein the fluorescent member contains the second fluorescent material in an amount of 0.5 parts by mass or more and 100 parts by mass or less relative to 100 parts by mass of the resin.

6. The light emitting device according to claim 2, comprising a fluorescent member containing the first fluorescent material, the second fluorescent material and a resin, wherein the fluorescent member contains the second fluorescent material in an amount of 0.5 parts by mass or more and 100 parts by mass or less relative to 100 parts by mass of the resin.

7. The light emitting device according to claim 5, wherein a total amount of the first fluorescent material and the second fluorescent material contained in the fluorescent member is 5 parts by mass or more and 150 parts by mass or less relative to 100 parts by mass of the resin therein.

8. The light emitting device according to claim 6, wherein a total amount of the first fluorescent material and the second fluorescent material contained in the fluorescent member is 5 parts by mass or more and 150 parts by mass or less relative to 100 parts by mass of the resin therein.

9. The light emitting device according to claim 1, which is used in combination with a light source that emits white light.

10. An illumination device comprising a combination of the light emitting device of claim 1, and a light source that emits a light energy different from that of the light emitting device of claim 1.

11. A plant cultivation method comprising irradiating plants with the light emitted by the light emitting device of claim 1.

* * * * *